US011255931B2

United States Patent
Suzuki et al.

(10) Patent No.: US 11,255,931 B2
(45) Date of Patent: Feb. 22, 2022

(54) TORQUE DETECTION DEVICE AND MAGNETIC SENSOR MODULE

(71) Applicants: DENSO CORPORATION, Kariya (JP); SOKEN, INC., Nisshin (JP)

(72) Inventors: Toshiro Suzuki, Kariya (JP); Satoru Jinno, Kariya (JP); Shigetoshi Fukaya, Kariya (JP); Ken Tanaka, Kariya (JP); Kensuke Kobayashi, Nisshin (JP)

(73) Assignees: DENSO CORPORATION, Kariya (JP); SOKEN, INC., Nisshin (JP)

( * ) Notice: Subject to any disclaimer, the term of this patent is extended or adjusted under 35 U.S.C. 154(b) by 112 days.

(21) Appl. No.: 16/748,934

(22) Filed: Jan. 22, 2020

(65) Prior Publication Data

US 2020/0158795 A1    May 21, 2020

Related U.S. Application Data

(63) Continuation of application No. PCT/JP2018/030667, filed on Aug. 20, 2018.

(30) Foreign Application Priority Data

Sep. 1, 2017  (JP) .............................. JP2017-168730
Jul. 20, 2018  (JP) .............................. JP2018-136685

(51) Int. Cl.
*G01R 33/09*     (2006.01)
*H02K 1/2753*    (2022.01)
(Continued)

(52) U.S. Cl.
CPC .............. *G01R 33/091* (2013.01); *G01L 3/10* (2013.01); *G01L 5/00* (2013.01); *G01L 5/0023* (2013.01);
(Continued)

(58) Field of Classification Search
CPC .. G01R 33/091; G01R 33/0011; G01R 33/07; G01R 33/06; G01L 5/00; G01L 3/10;
(Continued)

(56) References Cited

U.S. PATENT DOCUMENTS

2008/0250873 A1    10/2008  Prudham et al.
2012/0285266 A1    11/2012  Takahashi et al.
2013/0312539 A1    11/2013  Shimomura et al.

FOREIGN PATENT DOCUMENTS

DE    10 2007 043 502 A1    4/2009
JP        2010-122104 A     6/2010
(Continued)

*Primary Examiner* — Son T Le
(74) *Attorney, Agent, or Firm* — Posz Law Group, PLC

(57) ABSTRACT

A torsion bar of a torque detection device converts torque applied between an input shaft and an output shaft to a torsional displacement. A pair of yokes is secured to the output shaft, and forms a magnetic circuit in a magnetic field of a multipolar magnet secured to the input shaft. A magnetic flux guide member has a main body facing the yoke to guide magnetic flux of the magnetic circuit. A magnetic sensor is placed at an extension, and detects magnetic flux guided by the magnetic flux guide member. The magnetic flux guide member is configured to allow magnetic permeance per unit area between the magnetic flux guide member and the yoke to be greater at a location in the main body from which the extension is branched, than at a circumferential end portion of the main body.

14 Claims, 26 Drawing Sheets

(51) Int. Cl.
*H02K 1/14* (2006.01)
*G01R 33/00* (2006.01)
*G01L 3/10* (2006.01)
*G01L 5/00* (2006.01)
*G01R 33/07* (2006.01)

(52) U.S. Cl.
CPC ......... *G01R 33/0011* (2013.01); *H02K 1/146* (2013.01); *H02K 1/2753* (2013.01); *G01R 33/07* (2013.01)

(58) Field of Classification Search
CPC ....... G01L 3/101; G01L 3/104; G01L 5/0023; G01L 5/22; G01L 5/221; H02K 1/2753; H02K 1/146
See application file for complete search history.

(56) References Cited

FOREIGN PATENT DOCUMENTS

| | | |
|---|---|---|
| JP | 2011-089783 A | 5/2011 |
| JP | 2012-251814 A | 12/2012 |
| JP | 5529804 B2 | 6/2014 |

TORQUE DETECTION DEVICE AND MAGNETIC SENSOR MODULE

CROSS REFERENCE TO RELATED APPLICATION

The present application is a continuation application of International Patent Application No. PCT/JP2018/0030667 filed on Aug. 20, 2018, which designated the U.S. and claims the benefit of priority from Japanese Patent Application No. 2017-168730 filed on Sep. 1, 2017 and Japanese Patent Application No. 2018-136685 filed on Jul. 20, 2018. The entire disclosures of all of the above applications are incorporated herein by reference.

TECHNICAL FIELD

The present disclosure relates to a torque detection device and a magnetic sensor module.

BACKGROUND ART

A torque detection device includes a magnetic sensor that detects changes in magnetic flux, caused when a multipolar magnet and yokes rotate relative to each other, and torque applied to a torsion bar is detected based on signals output by the magnetic sensor.

SUMMARY

According to an aspect of the present disclosure, a torque detection device includes: a torsion bar, a multipolar magnet, a pair of yokes, one or more magnetic flux guide members, and one or more magnetic sensors. The torsion bar couples a first shaft and a second shaft concentrically, and is configured to convert torque applied between the first shaft and the second shaft to a torsional displacement. The multipolar magnet is secured to the first shaft or one end portion of the torsion bar and includes N-poles and S-poles disposed alternately in a circumferential direction. The pair of yokes is made of a soft magnetic material, placed outside of the multipolar magnet in a radial direction, secured to the second shaft or another end portion of the torsion bar, facing each other in an axial direction, and forming a magnetic circuit in a magnetic field of the multipolar magnet. The magnetic flux guide members are made of a soft magnetic material and each having a main body, the one or more magnetic flux guide members facing at least one of the yokes at the main body or main bodies and configured to guide magnetic flux of the magnetic circuit. The magnetic sensors are placed at the main body of each of the one or more magnetic flux guide members or at extensions branched from the main body, configured to detect magnetic flux guided by the one or more magnetic flux guide members. In a projection view of the yokes in the axial direction, an imaginary straight line connecting the magnetic sensor to a central axis of the yokes when a number of the magnetic sensors is one, and an imaginary straight line connecting a middle position of the magnetic sensors to the central axis of the yokes when the number of the magnetic sensors is more than one, are defined as a reference line. Portions of the main body of each of the one or more magnetic flux guide members corresponding to ends of the at least one of the yokes in the circumferential direction across the reference line within a range where the main body faces the at least one of the yokes are defined as circumferential end portions of the main body of each of the one or more magnetic flux guide members.

BRIEF DESCRIPTION OF DRAWINGS

The above and other objects, features and advantages of the present disclosure will become more apparent from the following detailed description made with reference to the accompanying drawings. In the drawings.

DESCRIPTION OF EMBODIMENTS

Figure 1:
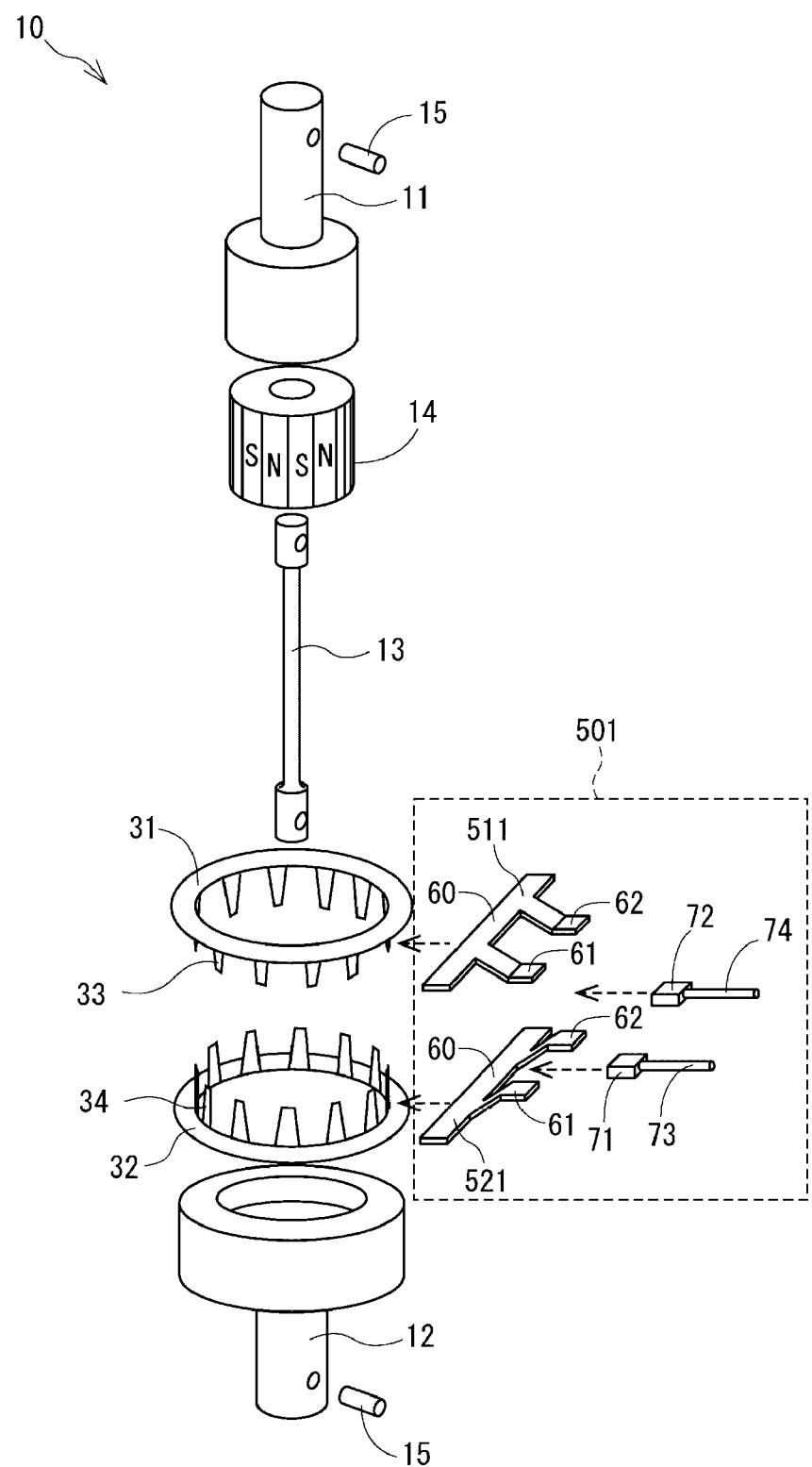
FIG. 1 is an exploded perspective view of a torque detection device according to each embodiment (with a magnetic sensor module according to a first embodiment)

To begin with, examples of relevant techniques will be described.

Conventional torque detection devices are known in which a magnetic sensor detects changes in magnetic flux, caused when a multipolar magnet and yokes rotate relative to each other, and torque applied to a torsion bar is detected based on signals output by the magnetic sensor. Some torque detection devices of this type are known to include a magnetic flux guide member for collecting magnetic flux from the yokes and guiding the magnetic flux to the magnetic sensor. A magnetic flux collecting ring, which corresponds to the magnetic flux guide member, has its inner edge at a maximized distance from the central axis of a multipolar magnet (or yokes) in a direction connecting the central axis of the multipolar magnet (or the yokes) and the magnetic sensor. This configuration inhibits cyclic fluctuations in magnetic flux caused in a magnetic circuit when the multipolar magnet and the yokes rotate in synchronization in a steady torque condition. Noise due to such cyclic fluctuations in magnetic flux is hereinafter referred to as "whirling noise."

This type of torque detection devices amplifies the output voltage from the magnetic sensor before transmitting it to the control unit, to improve the S/N ratio by increasing the signal and reducing the noise. However, the area where the magnetic flux guide member and the yoke face each other in the axial direction is relatively small in a location near the magnetic sensor. This facing area may be zero depending on embodiments. Higher magnetic resistance thus results when magnetic flux is collected with the magnetic flux guide members facing the yokes in a location away from the magnetic sensor than when magnetic flux is collected near the magnetic sensor, reducing the amount of magnetic flux collected by the sensor. As a result, the whirling noise and the signal are both reduced, posing an issue that enhancement of the S/N ratio is not expected.

The present disclosure provides a torque detection device that offers an improved S/N ratio of magnetic flux detected by a magnetic sensor, and a magnetic sensor module for use in the torque detection device.

According to the present disclosure, a torque detection device includes: a torsion bar, a multipolar magnet, a pair of yokes, one or more magnetic flux guide members, and one or more magnetic sensors. The torsion bar couples a first shaft and a second shaft concentrically, and is configured to convert torque applied between the first shaft and the second shaft to a torsional displacement. The multipolar magnet is secured to the first shaft or one end portion of the torsion bar and includes N-poles and S-poles disposed alternately in a circumferential direction. The pair of yokes is made of a soft magnetic material, placed outside of the multipolar magnet in a radial direction, secured to the second shaft or another end portion of the torsion bar, facing each other in an axial direction, and forming a magnetic circuit in a magnetic field of the multipolar magnet.

The magnetic flux guide members are made of a soft magnetic material and each having a main body, the one or more magnetic flux guide members facing at least one of the yokes at the main body or main bodies and configured to guide magnetic flux of the magnetic circuit. The magnetic sensors are placed at the main body of each of the one or more magnetic flux guide members or at extensions branched from the main body, configured to detect magnetic flux guided by the one or more magnetic flux guide members. In a projection view of the yokes in the axial direction, an imaginary straight line connecting the magnetic sensor to a central axis of the yokes when a number of the magnetic sensors is one, and an imaginary straight line connecting a middle position of the magnetic sensors to the central axis of the yokes when the number of the magnetic sensors is more than one, are defined as a reference line. Portions of the main body of each of the one or more magnetic flux guide members corresponding to ends of the at least one of the yokes in the circumferential direction across the reference line within a range where the main body faces the at least one of the yokes are defined as circumferential end portions of the main body of each of the one or more magnetic flux guide members.

In a first aspect of the present disclosure, the one or more magnetic flux guide members are configured to allow "magnetic permeance per unit area between the magnetic flux guide member and the yoke" to be greater at a location in the main body at which the magnetic sensor is placed, or at a location in the main body from which the extension is branched, than at the circumferential end portion. The reference signs for the magnetic flux guide members in the first aspect correspond to "51, 52," the generic signs for the magnetic flux guide members, except for "560, 570" of a second aspect of the present disclosure. Signals detected by the one or more magnetic sensors are increased in this manner, and thus the S/N ratio can be improved.

A distance from the location in the main body of the magnetic flux guide members at which the magnetic sensor is placed, or from the location in the main body from which the extension is branched, to the central axis of the yokes is preferably shorter than a distance from the circumferential end portion to the central axis of the yokes. For example, it is preferable that the magnetic flux guide member has a side near the central axis of the yokes, the side being a straight line orthogonal to the reference line. The size of the magnetic flux guide member can be reduced by using the main body of the magnetic flux guide member having a rectangular strip shape. Additionally, when the magnetic flux guide members are, for example, punched out from a metal sheet using a press during manufacturing, yield can be improved depending on the design of the magnetic flux guide members.

When the torque detection device includes two magnetic sensors symmetrically disposed with respect to the reference line, magnetic flux bifurcates toward the two magnetic sensors from a location in the magnetic flux guide member on the reference line. It is thus envisaged that noise propagating to the magnetic sensors is reduced. Thus, the S/N ratio of the magnetic flux detected by the magnetic sensors can be further improved.

The present disclosure also provides a magnetic sensor module for use in the torque detection device described above. The magnetic sensor module includes the one or more magnetic flux guide members and the one or more magnetic sensors, integral with one another. For example, the magnetic sensor module is configured by molding the magnetic flux guide members and magnetic sensors in resin integrally. The magnetic sensor module can be manufactured for sale independently as a component of a torque detection device and produces an effect of improving the S/N ratio when used in the torque detection device.

According to a second aspect of the present disclosure, the torque detection device includes two magnetic sensors. Further, the magnetic flux guide member has a side near the central axis of the yokes, the side being a straight line orthogonal to the reference line. The two magnetic sensors are disposed symmetrically with respect to the reference line. The magnetic flux guide member is configured to allow magnetic permeance per unit area between the magnetic flux guide member and the yoke to be smaller at locations in the main body at which the magnetic sensors are placed, or at locations in the main body from which the extensions are branched, than at a location on the reference line. In the second aspect, the signal detected by the magnetic sensor is smaller than in the first aspect. However, the S/N ratio can be improved when magnetic flux bifurcates toward the two magnetic sensors from a location in the magnetic flux guide member on the reference line such that noise propagating to the magnetic sensors is reduced. The size of the magnetic flux guide member can be reduced by the main body of the magnetic flux guide member having a rectangular strip shape.

Some embodiments of a torque detection device are described below with reference to the drawings. In the following embodiments, substantially identical constituent elements are designated with identical symbols with the duplicate description omitted.

First to fourteenth embodiments described below are collectively referred to as "the present embodiments." The torque detection device according to the present embodiments is used in an electric power steering system for assisting steering operation in a vehicle.

Figure 2:
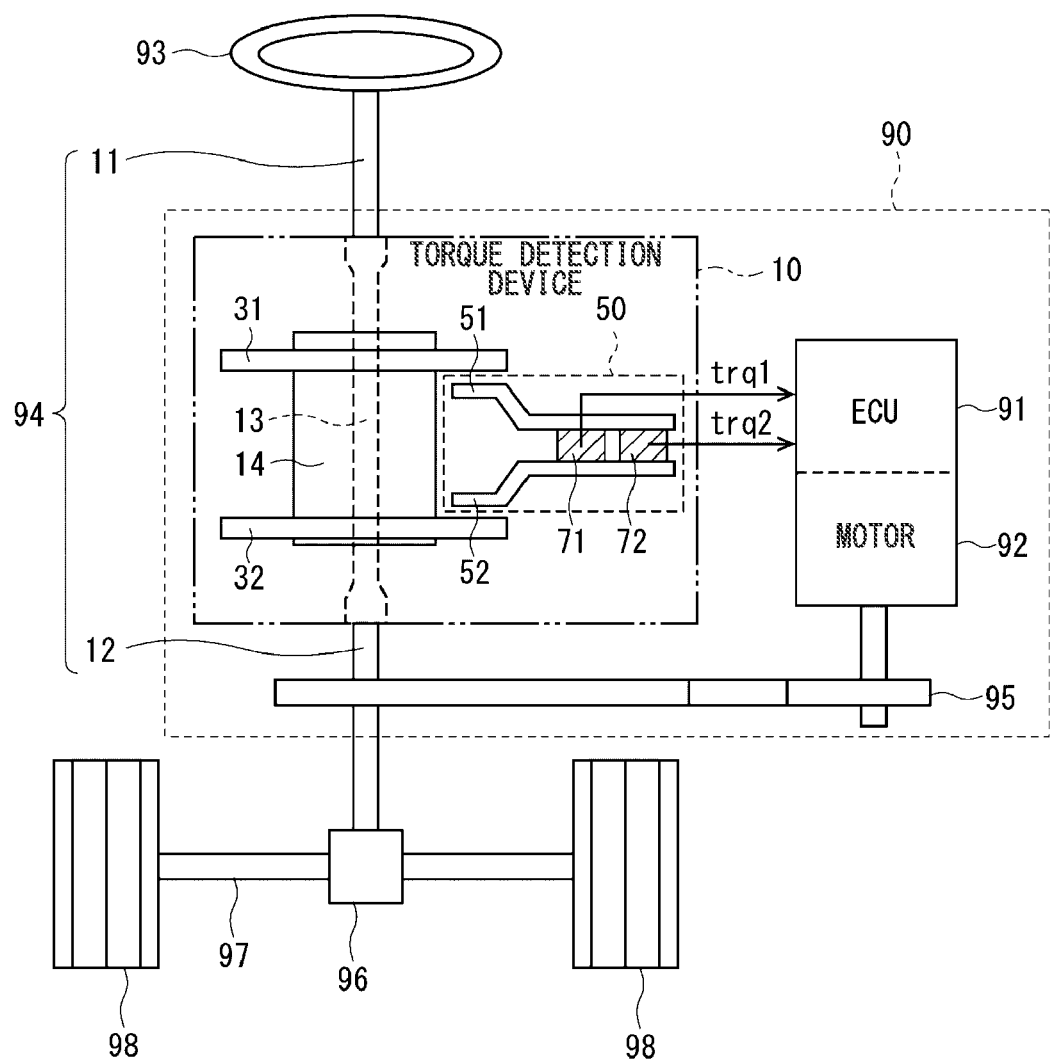
FIG. 2 is a schematic configuration diagram of an electric power steering system in which the torque detection device according to each embodiment is used.

With reference to FIG. 2, a schematic configuration of an electric power steering system is described. The torque detection device according to each embodiment is used in the electric power steering system. While the electric power steering system 90 illustrated in FIG. 2 is of a column assist type, the torque detection device can be also used in rack assist electric power steering systems. A steering shaft 94 is connected to a steering wheel 93 and provided with a torque detection device 10 for detecting steering torque. The steering shaft 94 has an end at which a pinion gear 96 is disposed, and the pinion gear 96 is in mesh with a rack 97. The rack 97 has ends that are rotatably coupled to a pair of wheels 98 via tie rods and the like. Rotational motion of the steering shaft 94 is converted by the pinion gear 96 to linear motion of the rack 97, thereby steering the pair of wheels 98.

The steering shaft 94 includes an input shaft 11 and an output shaft 12, between which the torque detection device 10 is disposed. The torque detection device 10 detects steering torque applied to the steering shaft 94 and outputs it to an ECU 91. The ECU 91 controls the output of a motor 92 in response to the detected steering torque. The motor 92 generates a steering assist torque that is reduced by a reduction gear 95 and transmitted to the steering shaft 94.

The torque detection device 10 includes two magnetic sensors 71 and 72 and thus outputs two values trq1 and trq2 as the steering torque. This configuration is applicable to embodiments such as the first to tenth embodiments. Because of the redundant torque information provided for the ECU 91, the ECU 91 can continue controlling the motor 92 by using one of the torque values even if the other torque value becomes unavailable due to the failure of the corresponding magnetic sensor or arithmetic circuit. This kind of redundant configuration is particularly effective for the electric power steering system 90, which is required to satisfy a high level of reliability. Note that the torque detection device 10 may include one magnetic sensor 71 as in the eleventh and twelfth embodiments.

An overall configuration of the torque detection device 10 is described next with reference to FIGS. 1 and 2. As illustrated in FIG. 2, the torque detection device 10 includes a torsion bar 13, a multipolar magnet 14, a pair of yokes 31 and 32, one or more magnetic flux guide members 51 and 52, and one or more magnetic sensors 71 and 72. A unit including the one or more magnetic flux guide members 51 and 52 and the one or more magnetic sensors 71 and 72 is referred to as a magnetic sensor module 50.

In FIG. 2, which illustrates the shapes of the constituent elements schematically, the magnetic sensor module according to each embodiment is designated with a symbol 50, and the magnetic flux guide members according to each embodiment are designated with 51 and 52. In FIG. 1, which illustrates the shapes of the magnetic flux guide members of the first embodiment specifically, the magnetic sensor module according to the first embodiment is designated with 501, and the magnetic flux guide members according to the first embodiment are designated with 511 and 521. The magnetic flux guide members 51 and 52 are different in specific shapes in different embodiments, and the magnetic sensors 71 and 72 are different in number in different embodiments. For the description provided in this portion, just the overall configuration of the torque detection device 10 is referenced without discussing the specific shapes of the magnetic flux guide members 511 and 521 in FIG. 1.

As illustrated in FIGS. 1 and 2, the torsion bar 13 has one end secured to the input shaft 11 and the other end secured to the output shaft 12 using respective securing pins 15, thereby coupling the input shaft 11 and the output shaft 12 concentrically on a central axis O. The input shaft 11 corresponds to a first shaft, and the output shaft 12 corresponds to a second shaft. The torsion bar 13 is an elastic member having a rod shape for converting a steering torque applied to the steering shaft 94 to a torsional displacement. In the multipolar magnet 14, which is secured to the input shaft 11, the N-poles and S-poles are disposed alternately in a circumferential direction. Eight N-poles and eight S-poles, a total of 16 poles, are disposed at 22.5° spacings in the present embodiments.

Each of the yokes 31 and 32 has a ring shape, made of a soft magnetic material. The yokes 31 and 32 are placed outside of the multipolar magnet 14 in a radial direction and secured to the output shaft 12, facing each other with a gap therebetween in an axial direction. The yoke 31 has a ring portion, and claws 33 are placed on an inner edge of the ring portion at regular spacings for the entire perimeter. The yoke 32 has a ring portion, and claws 34 are placed on an inner edge of the ring portion at regular spacings for the entire perimeter. The number of the claws 33 and that of the claws 34 are each the same as that of the N-poles or S-poles of the multipolar magnet 14. The claws 33 of the yoke 31 and the claws 34 of the yoke 32 are shifted in the circumferential direction, placed alternately. The yokes 31 and 32 thus form a magnetic circuit in a magnetic field generated by the multipolar magnet 14.

When torsional displacement is applied to the torsion bar 13, magnetic flux passing through the magnetic circuit changes as the multipolar magnet 14 and the yokes 31 and 32 rotate relative to each other. By detecting the magnetic flux, rotary angle information is obtained. The principle behind the detection is described in FIGS. 5 and 6 of JP 2012-237727 A, which is incorporated by reference.

The central axis O may be defined using any of the torsion bar 13, the multipolar magnet 14, and the yokes 31 and 32 as the reference, since they are all placed concentrically. As used herein, the yokes 31 and 32 whose relationship with the magnetic flux guide members 51 and 52 is noted in terms of how they face with each other are used as the reference, and the central axis O is basically described as "the central axis O of the yokes 31 and 32."

In the description of the embodiments, the axial direction and radial direction of the torsion bar 13, the multipolar magnet 14, the yokes 31 and 32, and the like are simply referred to as the "axial direction" and the "radial direction." In the description of the drawings, a plan view refers to a view observed from the first shaft 11 in the axial direction, and a side view refers to a view observed from the radial direction. The wording "in a plan view" is synonymous with "in a projection view in the axial direction."

The magnetic flux guide members 51 and 52 are made of a soft magnetic material and each have a main body 60. The magnetic flux guide members 51 and 52 face at least one of the yokes 31 and 32 at the main bodies 60 in the axial direction or radial direction and guide magnetic flux of the magnetic circuit to the magnetic sensors 71 and 72. In many embodiments except for the fourteenth embodiment, a pair of magnetic flux guide members 51 and 52 is provided.

For convenience of description herein, the yoke 31 and magnetic flux guide member 51 disposed toward the first shaft 11 in FIGS. 1 and 2 may be referred to as "the upper yoke 31" and "the upper magnetic flux guide member 51," respectively. The yoke 32 and magnetic flux guide member 52 disposed toward the second shaft 12 may be referred to as "the lower yoke 32" and "the lower magnetic flux guide member 52," respectively. The upper magnetic flux guide member 51 faces the upper yoke 31, and the lower magnetic flux guide member 52 faces the lower yoke 32. In many embodiments except for the thirteenth embodiment, the yokes 31 and 32 are symmetrically disposed and face each other in the axial direction.

As illustrated in FIG. 1, each of the magnetic flux guide members 511 and 521 in the first embodiment has extensions 61 and 62 branching from the corresponding main body 60. Specifically, the extensions 61 and 62 extend from the main body 60 toward the outside of the yokes 31 and 32 in the radial direction. The magnetic sensor 71 is disposed between the extensions 61, and the magnetic sensor 72 is disposed between the extensions 62. The extensions 61 each have a step in the axial direction so as to have a minimum gap therebetween in a location where the magnetic sensor 71 is placed. The extensions 62 each have a step in the axial direction so as to have a minimum gap therebetween in a location where the magnetic sensor 72 is placed. If the magnetic flux guide members 51 and 52 are, for example, press-formed, the steps in the extensions 61 and 62 can be formed by bending a metal sheet.

The magnetic sensors 71 and 72 detect magnetic flux guided by the magnetic flux guide members 51 and 52 from the yokes 31 and 32, convert the magnetic flux to voltage signals, and output the signals to the external ECU 91 via leads 73 and 74. Each of the magnetic sensors 71 and 72 is, for example, an IC package having a substantially rectangular parallelepiped shape, made of a Hall element, magneto-resistive element, or the like molded in resin.

In the torque detection device configured as described above, magnetic flux passing through the magnetic circuit cyclically fluctuates when steady torque is applied to the torsion bar 13, and the multipolar magnet 14 and the yokes 31 and 32 rotate in synchronization. The cyclic fluctuations in magnetic flux can cause "whirling noise" to signals output by the magnetic sensors 71 and 72 to the ECU 91.

Figure 33:
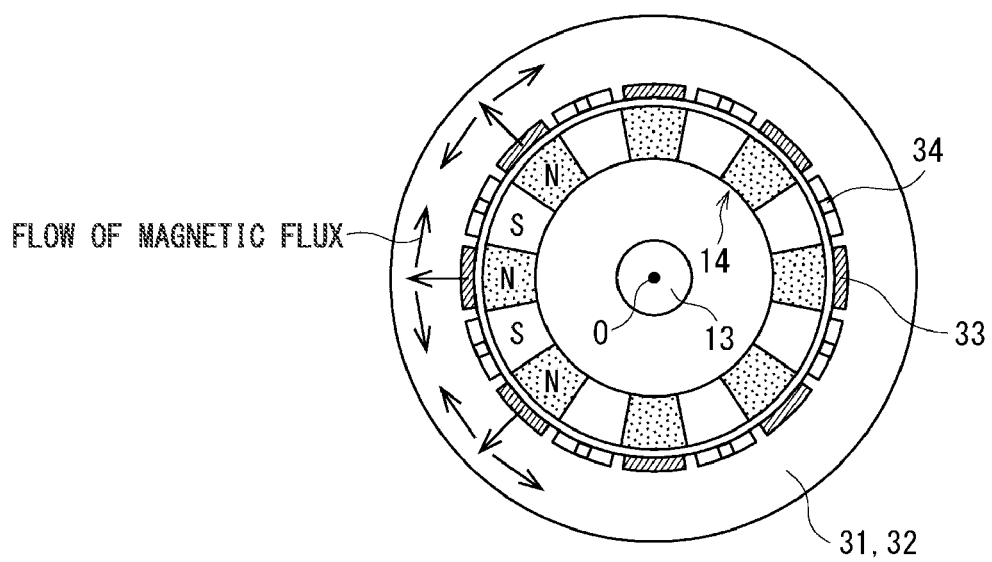
FIG. 33 is a reference diagram illustrating the flow of magnetic flux from claws to a ring portion of the yoke.

With reference to FIG. 33, a reference drawing illustrating the flow of magnetic flux from the claws to the ring portions of the yokes, the whirling noise is described. Different locations in the ring portions of the yokes 31 and 32 have different magnetic flux densities depending on the distance from the claws 33 and 34 of the yokes 31 and 32, which face the multipolar magnet 14 serving as the magnetic flux source. Specifically, the magnetic flux density increases in locations close to the claws 33 and 34 and decreases in locations away from the claws 33 and 34.

When the multipolar magnet 14 and the yokes 31 and 32 rotate in synchronization, a magnetic sensor placed at a specific location between the ring portions of the yokes 31 and 32 detects fluctuations in magnetic flux caused in association with the rotation. Leakage flux from between the claws 33 and 34 is added on in association with the rotation, increasing the fluctuations in magnetic flux. The increased fluctuations are detected by the magnetic sensor as whirling noise. If the whirling noise becomes large relative to the signal that results from detection of the magnetic sensor, the S/N ratio is lowered.

As a solution for the noise, in a comparison example, a magnetic flux collecting ring is provided, (which corresponds to the magnetic flux guide member in the present embodiments) having a shape defined to maximize the distance from the central axis O to its inner edge in the direction connecting the central axis O and the magnetic sensor. The magnetic flux collecting ring has, for example, an elliptical arc shape having a major axis in the direction connecting the central axis O and the magnetic sensor. In the comparison example, the magnetic sensor is placed away from the multipolar magnet, to inhibit the effect of the magnetic flux fluctuations on the magnetic sensor.

In the comparison example, however, the area where the magnetic flux guide member and the yoke face each other in the axial direction is relatively small in a location near the magnetic sensor. This facing area may be zero depending on embodiments. Higher magnetic resistance thus results when magnetic flux is collected with the magnetic flux guide members facing the yokes in a location away from the magnetic sensor than when magnetic flux is collected near the magnetic sensor, reducing the amount of magnetic flux collected by the sensor. As a result, the whirling noise and the signal are both reduced, posing a problem that enhancement of the S/N ratio is not expected.

The present embodiments provides an improved S/N ratio of magnetic flux detected by a magnetic sensor by providing a stronger signal from the magnetic sensor in locations closer to the magnetic sensor while inhibiting the whirling noise. The tenth embodiment is an exception where the S/N ratio is improved by the effect of inhibiting the noise only, without increasing the signal.

Some of the embodiments further enable reduction in size of the magnetic sensor module 50 and improvement of assembly ease. The magnetic flux collecting ring, in the comparison example, for example, has a half-ring shape and is superior in assembly ease to a magnetic flux collecting ring having a full-ring shape, because the torsion bar 13 and the multipolar magnet 14 would have to be caused to pass through the full ring during the assembly whereas the half ring can be attached from the radial direction. Some of the embodiments not only permit the installation from the radial direction but also enable reduction in size of the magnetic sensor module 50, improvement of manufacturing yield, reduction of a component management space, and further improvement of assembly ease.

A detailed configuration of the magnetic sensor module 50 according to each of the embodiments is described next with reference to FIG. 3A to FIG. 22B. In the description below of the first to ninth embodiments, the magnetic sensor module is designated with a sign "50" followed by the number of the corresponding embodiment in the third digit, and each of the magnetic flux guide members is designated with a sign "51" or "52" followed by the number of the corresponding embodiment in the third digit. In the description below of the tenth to fourteenth embodiments, the magnetic sensor module is designated with a sign "55" followed by one of "1" to "4" in the third digit, respectively. In the description below of the tenth to thirteenth embodiments, each of the magnetic flux guide members is designated with a sign "56" or "57" followed by one of "0" to "3" in the third digit, respectively. In the description below of the fourteenth embodiment, the magnetic flux guide member, provided on one side only, is designated with a sign "564."

Figure 3A:
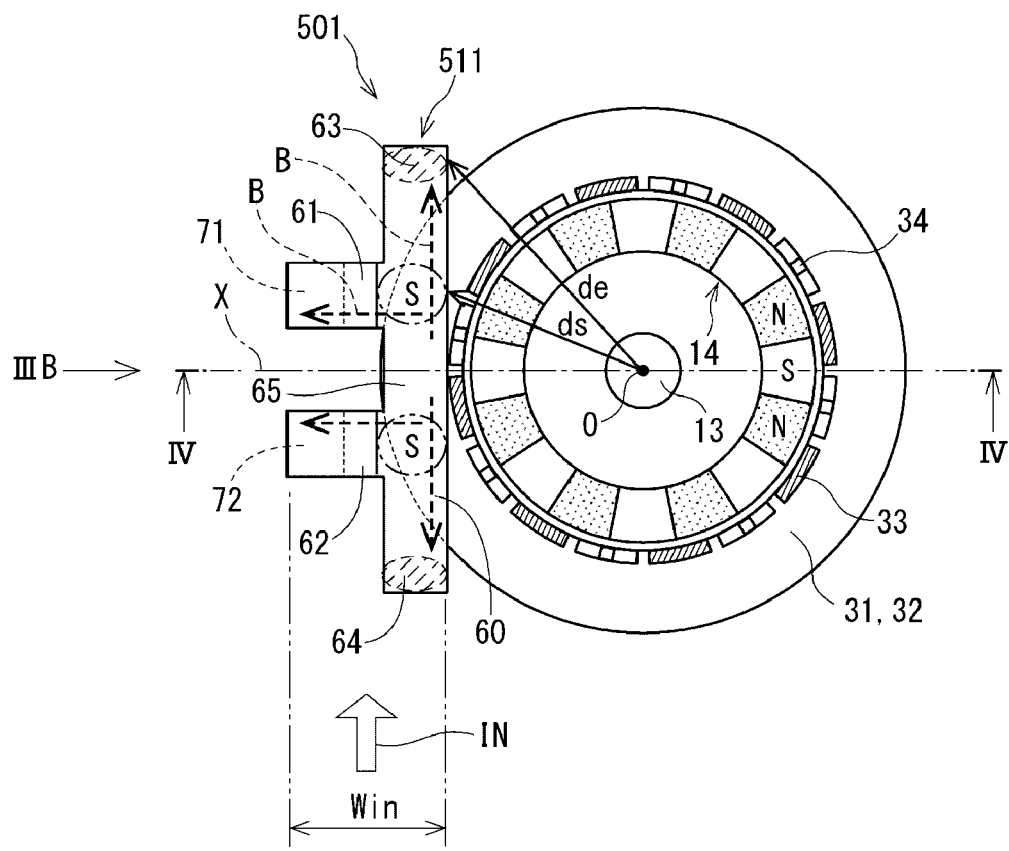
FIG. 3A is a plan view of the magnetic sensor module according to the first embodiment.

The configuration of the magnetic sensor module in each of the embodiments is basically illustrated using three drawings: a plan view, a side view, and an axial-direction sectional view. A drawing provided for one embodiment may be referenced to describe another embodiment as appropriate if the drawings are substantially the same. As used herein, the wording "in a plan view" or the like means "when viewed in the plan view." In the first embodiment, FIG. 3A provides a plan view, FIG. 3B a side view, and FIG. 4 an axial-direction sectional view. Although the "plan view" here is, in a strict sense, a sectional view in the radial direction, cutting through the multipolar magnet 14 and the claws 33 and 34 of the yokes 31 and 32 at an upper location of the upper magnetic flux guide member 51, the view is referred to as a "plan view" from the viewpoint of the magnetic flux guide member 51. The ring portion that is visible when viewed in the sectional view in the radial direction is of the lower yoke 32 only, but the signs "31 and 32" are both indicated including the upper yoke 31 for the convenience of description.

Figure 19:
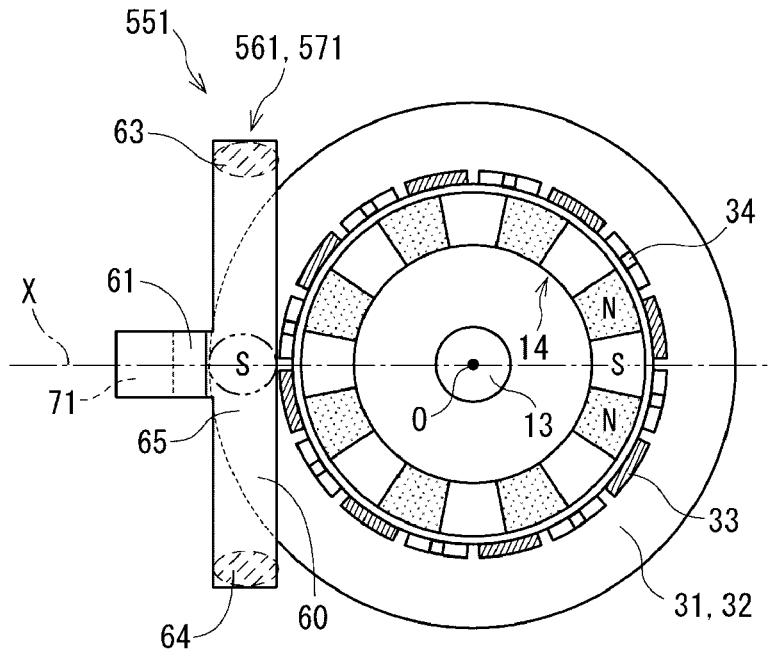
FIG. 19 is a plan view of a magnetic sensor module according to an eleventh embodiment.

In each plan view, a "reference line X" extending through the central axis O in the right-and-left direction on the page is indicated. In FIG. 3A and other drawings that include two magnetic sensors 71 and 72, the reference line X is defined as an imaginary straight line connecting a middle position between the magnetic sensors 71 and 72 to the central axis O. In other words, the two magnetic sensors 71 and 72 are disposed symmetrically with respect to the reference line X. In FIG. 19 and other drawings that include one magnetic sensor 71, the reference line X is defined as an imaginary straight line connecting the one magnetic sensor 71 and the central axis O. Each plan view illustrates a neutral state where no torsional displacement is applied to the torsion bar 13. In the neutral state, a center line of a magnetic pole (an S-pole in the example in FIG. 3A) is coincident with the reference line X.

The side view is a view of the magnetic sensor module 50 along the reference line X from the outside in the radial direction. Chain double-dashed lines indicate the external shapes of the claws 33 and 34. In the side view, illustration of the torsion bar 13 and the multipolar magnet 14 is omitted. The axial-direction sectional view is a sectional view along a plane including the central axis O and the reference line X. In the axial-direction sectional view, the illustration of the torsion bar 13 is omitted and the outline only is indicated for the multipolar magnet 14.

First Embodiment

Figure 3B:
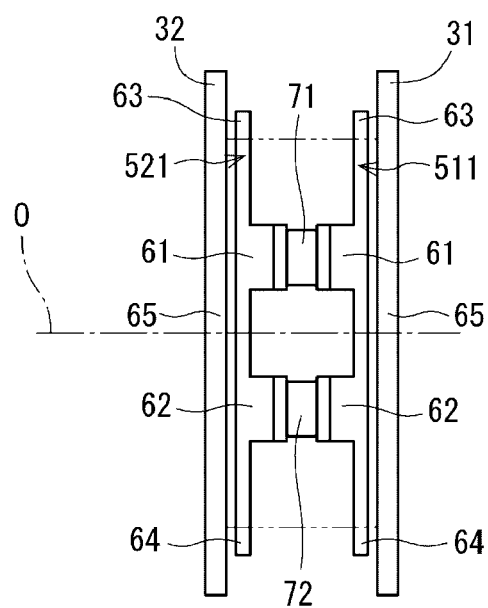
FIG. 3B is a side view of the magnetic sensor module according to the first embodiment.
Figure 4:
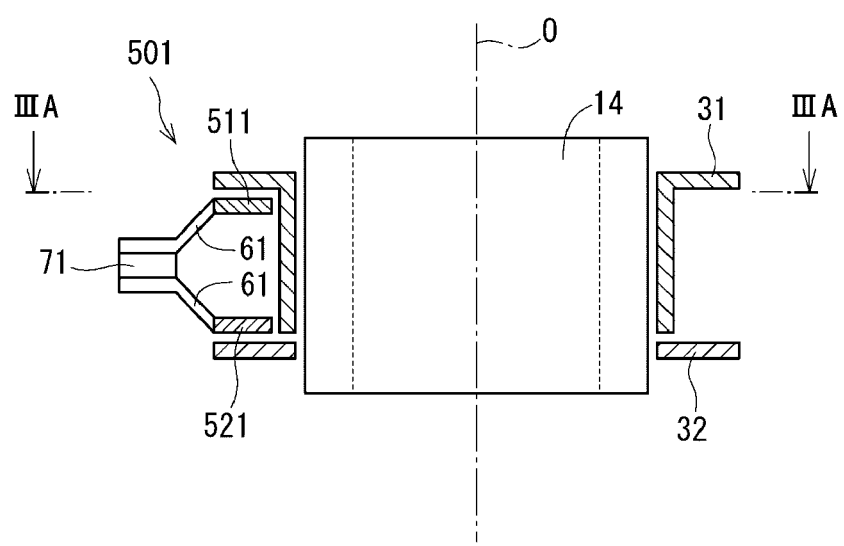
FIG. 4 is an axial-direction sectional view of the magnetic sensor module according to the first embodiment.

With reference to FIGS. 3A, 3B, and 4, the first embodiment is described below. In a magnetic sensor module 501 according to the first embodiment, each of the main bodies of the magnetic flux guide members 511 and 521 has a rectangular strip shape symmetrical with respect to the reference line X in the plan view. Each of the magnetic flux guide members 511 and 521 has a side near the central axis O, and this side is a straight line intersecting with the reference line X at right angles inside yokes 31 and 32.

Each of the magnetic flux guide members 511 and 521 includes the extensions 61 and 62 extending from the corresponding main body 60 toward the outside in the radial direction. "Locations in the main body 60 from which the extensions 61 and 62 are branched" are referred to as S portions. The "locations from which the extensions 61 and 62 are branched" substantially signify the proximity to the magnetic sensors 71 and 72. While the "S portion" uses the same symbol as the S-pole of the multipolar magnet 14, the distinction between the two is obvious and there is no risk of causing confusion.

Portions of each of the main bodies 60 of the magnetic flux guide members 511 and 521 corresponding to ends of the yokes 31 and 32 in the circumferential direction across the reference line X within a range where the main bodies 60 face the yokes 31 and 32 are defined as "circumferential end portions 63 and 64 of the main body 60" and hatched with broken lines in the drawing. The circumferential end portions 63 and 64 are portions that correspond to the ends of the yokes 31 and 32 in the circumferential direction within the range where the main bodies 60 face the yokes 31 and 32 and thus do not have to be directly included in this facing range. For example, the circumferential end portions 63 and 64 may be located outside of the directly facing range, i.e., located away from the reference line X, and correspond to "the ends of the yokes 31 and 32 in the circumferential direction within the directly facing range." A distance ds from either of the S portions to the central axis O is shorter than a distance de from either of the circumferential end portions 63 and 64 to the central axis O.

In the side view and axial-direction sectional view, each of the magnetic flux guide members 511 and 521 faces a surface of the ring portion of the corresponding one of the yokes 31 and 32 from inside of the yokes 31 and 32 in the axial direction. The gap therebetween is constant. The area where each of the magnetic flux guide members 511 and 521 faces the surface of the ring portion of the corresponding one of the yokes 31 and 32 (the area hereinafter referred to as the "facing area") is relatively large at a corresponding intermediate portion 65 that is close to the magnetic sensors 71 and 72, and becomes smaller at locations closer to the corresponding circumferential end portions 63 and 64. The S portions, which are locations from which the extensions 61 and 62 are branched, have larger facing areas than do the circumferential end portions 63 and 64, thus having greater magnetic permeance per unit area between each of the magnetic flux guide members 511 and 521 and the corresponding one of the yokes 31 and 32.

Here, "per unit area" is significant in that, when magnetic permeance is compared between different locations, the wording explicitly states that the areas of the locations are the same. In the description of the embodiments provided below where the wording "per unit area" is omitted, it is to be understood that "magnetic permeance" means "magnetic permeance per unit area."

The magnetic sensor 71 is disposed between the extensions 61, and the magnetic sensor 72 is disposed between the extensions 62. The extensions 61 are each bent to have a step in the axial direction so as to have a minimum gap therebetween in a location where the magnetic sensor 71 is placed. The extensions 62 are each bent to have a step in the axial direction so as to have a minimum gap therebetween in a location where the magnetic sensor 72 is placed. This configuration of the extensions 61 and 62 is also common in the second to seventh and ninth to eleventh embodiments described below.

Figure 5A:
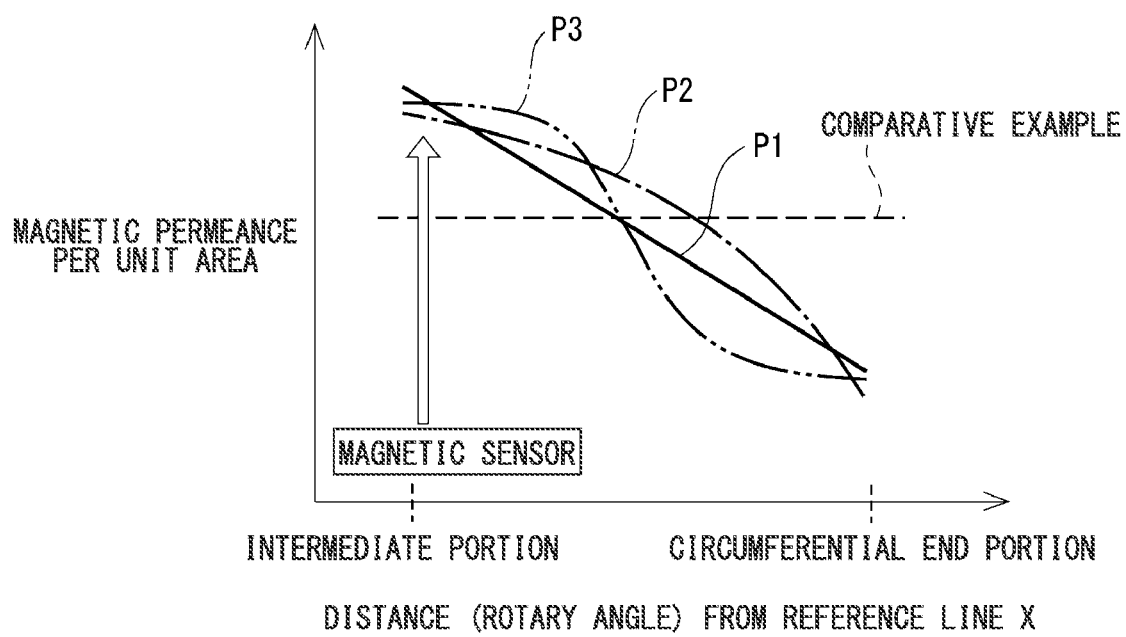
FIG. 5A is a correlation diagram between a distance from a reference line and magnetic permeance in the first embodiment.
Figure 5B:
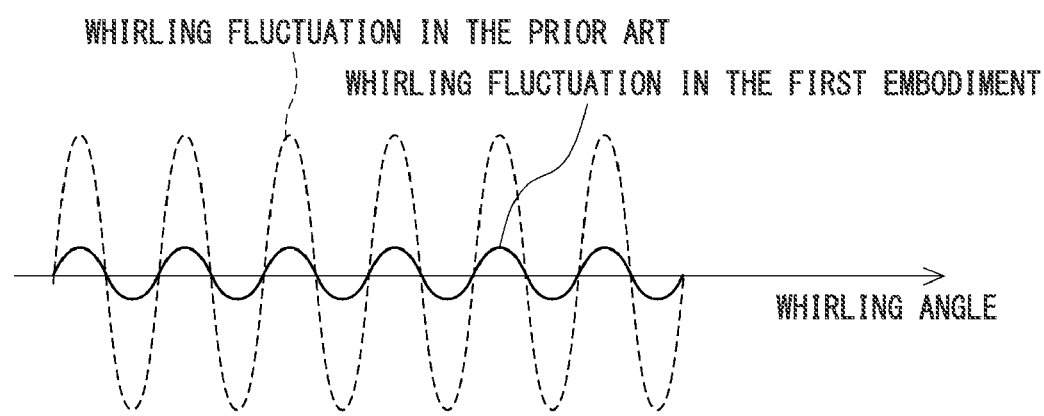
FIG. 5B is a diagram for describing reduction of whirling fluctuation in the first embodiment.
Figure 6:
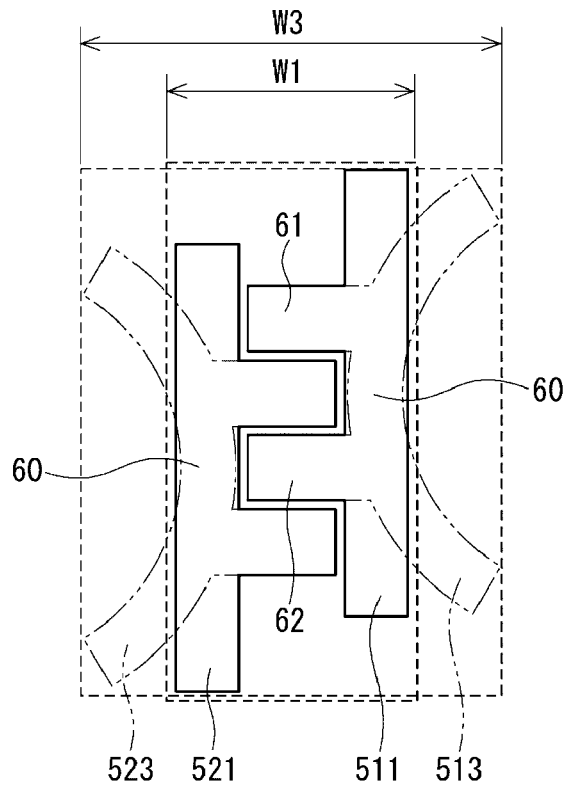
FIG. 6 is a diagram for describing improvement of manufacturing yield achieved by using magnetic flux guide members according to the first embodiment.

With reference to FIGS. 5A, 5B, and 6, an operational advantage is described below of the magnetic sensor module 50 according to each of the embodiments except for the tenth embodiment. A reason that the signal is increased is described first. FIG. 5A is a correlation diagram between a distance or rotary angle from the reference line X and magnetic permeance between the magnetic flux guide members 51 and 52 and the yokes 31 and 32. Magnetic permeance P is described in an expression (1) using magnetic permeability μ of a material, a facing area A, and a gap length L.

$$P = \mu(A/L) \qquad (1)$$

Assuming here that each of the magnetic flux guide members 51 and 52 is made of a single soft magnetic material, a larger facing area A where each of the magnetic flux guide members 51 and 52 faces the corresponding one of the yokes 31 and 32, or a shorter gap length L, results in greater magnetic permeance P.

In some embodiments including the first embodiment, the gap between each of the magnetic flux guide members 51 and 52 and the corresponding one of the yokes 31 and 32 is constant while the facing area where each of the magnetic flux guide members 51 and 52 faces the corresponding one of the yokes 31 and 32 is relatively large at the intermediate portion 65 and becomes smaller at locations closer to the circumferential end portions 63 and 64. In other embodiments including the third embodiment described below, the facing area where each of the magnetic flux guide members 51 and 52 faces the corresponding one of the yokes 31 and 32 is constant while the gap is relatively small at the intermediate portion 65 and becomes larger at locations closer to the circumferential end portions 63 and 64. Thus, in any of the embodiments, the magnetic permeance at the intermediate portion 65 is greater than that at the circumferential end portions 63 and 64. This correlation may have any characteristic such as, in FIG. 5A, a straight line as P1, a simple curve with no inflection points as P2, an S-shaped curve as P3, and a step-like broken line.

JP 5090162 B1 and U.S. Pat. No. 7,644,635, which are incorporated by reference, disclose a configuration where "magnetic permeance between the magnetic flux guide member and the yoke is independent of the relative radial and angular position." This means that this configuration has a characteristic where the magnetic permeance is constant regardless of the distance from the reference line X. This characteristic is indicated with a broken line in FIG. 5A as a comparative example. The characteristics of the present embodiments are clearly different from that of the comparative example in that the magnetic permeance changes depending on the distance or rotary angle from the reference line X.

In each of the embodiments except for the tenth embodiment, the magnetic sensors 71 and 72 are placed at the main bodies 60 near the intermediate portions 65 or at the extensions 61 and 62 branched from the main bodies 60. The magnetic sensors 71 and 72 are not necessarily required to be in contact with the extensions 61 and 62 and may be placed at locations near the extensions 61 and 62 in a noncontact manner. The locations in the main bodies 60 of the magnetic flux guide members 51 and 52 at which the magnetic sensors 71 and 72 are placed, or the locations in the main bodies 60 from which the extensions 61 and 62 are branched, substantially signify "the proximity to the magnetic sensors 71 and 72." The magnetic flux guide members 51 and 52 are configured to allow "the magnetic permeance per unit area between each of the magnetic flux guide members 51 and 52 and the corresponding one of the yokes 31 and 32" to be greater at the locations in the main bodies 60 at which the magnetic sensors 71 and 72 are placed, or the locations in the main bodies 60 from which the extensions 61 and 62 are branched, than at the circumferential end portions 63 and 64. In this way, signals from the magnetic sensors 71 and 72 can be increased.

A reason that the whirling noise is reduced is described next. Torque detection devices, in the comparison example, use a magnetic flux collecting ring in a full ring shape that matches the ring shape of the yoke, a half ring shape, a semi-oval shape, or the like. Such shapes permit collection of magnetic flux from a wide range of the magnetic flux collecting ring for the magnetic sensor, thus collecting fluctuations in magnetic flux from various locations as well as increasing signals to some extent, resulting in significant whirling fluctuation. In contrast, each of the embodiments except for the tenth embodiment is configured to reduce the magnetic permeance between each of the yokes 31 and 32 and the corresponding one of the magnetic flux guide members 51 and 52 at the circumferential end portions 63 and 64, which are located away from the magnetic sensors 71 and 72.

In FIG. 3A for the first embodiment, magnetic flux flows between each of the yokes 31 and 32 and the corresponding one of the magnetic flux guide members 511 and 521, particularly at the S portions having large magnetic permeance. The magnetic flux reaching the magnetic flux guide members 511 and 521 spreads out toward the circumferential end portions 63 and 64 as indicated by broken line arrows B. This is because the circumferential end portions 63 and 64 of the magnetic flux guide members 511 and 521 have a low magnetic flux density and small magnetic resistance, unlike the magnetic flux collecting rings used in the torque detection devices based on the prior art. Thus, fluctuations in magnetic flux that flows toward the magnetic sensors 71 and 72 along the extensions 61 and 62 are inhibited. In other words, an effect of smoothing magnetic flux is produced.

For example, in the neutral state where the magnetic poles of the multipolar magnet 14 are located between the claws 33 and 34 of the two yokes 31 and 32, i.e., when there is no torque applied, the magnetic flux collecting ring based on the prior art only collects the magnetic flux, allowing significant whirling noise to occur. In contrast, the magnetic flux guide members 511 and 521 according to the first embodiment, which are structured to inhibit fluctuations in magnetic flux collected, reduce fluctuations in whirling noise, as illustrated in FIG. 5B. Moreover, the magnetic flux guide members 511 and 521 according to the first embodiment provided with the two magnetic sensors 71 and 72 cause magnetic flux guided from the yokes 31 and 32 to bifurcate toward the two magnetic sensors 71 and 72 from the location of the reference line X and spread toward the circumferential end portions 63 and 64. This action can reduce propagating whirling noise.

Additionally, effect on reduction of the signal from the magnetic sensors 71 and 72 is small. This is because magnetic flux is collected in a condition where magnetic permeance between each of the magnetic flux guide members 511 and 521 and the corresponding one of the yokes 31 and 32 is increased in the proximity to the magnetic sensors 71 and 72, which have most significant contribution to the collectable amount of magnetic flux. Thus, each of the embodiments except for the tenth embodiment can provide increased signal (S) and reduced whirling noise (N) in comparison to the prior art. The S/N ratio of the magnetic flux detected by the magnetic sensors 71 and 72 can be thus improved.

With reference to FIG. 6, improvement of manufacturing yield achieved by using the magnetic flux guide members 511 and 512 according to the first embodiment is described next. When, for example, the two magnetic flux guide members 511 and 512 are punched out from a metal sheet using a press, the magnetic flux guide members 511 and 512 are arranged in the metal sheet such that the main bodies 60 face each other with the protrusions and recesses of the extensions 61 and 62 fitting with each other. The metal sheet for obtaining the two magnetic flux guide members 511 and 512 has a width W1 because the side opposite to the extensions 61 and 62 is a straight line.

For comparison, magnetic flux guide members 513 and 523 according to the third embodiment, each of which has an arc shape, are indicated with chain double-dashed lines. A metal sheet for obtaining the two magnetic flux guide members 511 and 512 needs to have a width W3, resulting in a significant amount of material waste. In contrast, the first embodiment can minimize material waste, improving manufacturing yield. Furthermore, each of the magnetic flux guide members 511 and 521 has a reduced width in a reference line X direction. Thus, each of the magnetic flux guide members 511 and 521 can be installed in the torque detection device 10 by sliding it as indicated by a block arrow IN in FIG. 3A, and a space required for the installation has a width Win. Thus, the assembly ease can be further improved so as to be better than that of, for example, a magnetic flux guide member having a half-ring shape.

Second Embodiment

A magnetic sensor module 502 according to the second embodiment is described with reference to FIGS. 3B and 4, the drawings for the first embodiment, as its side view and axial-direction sectional view. In the plan view provided in FIG. 7, magnetic flux guide members, including a lower magnetic flux guide member, are designated with signs "512, 522."

Figure 7:
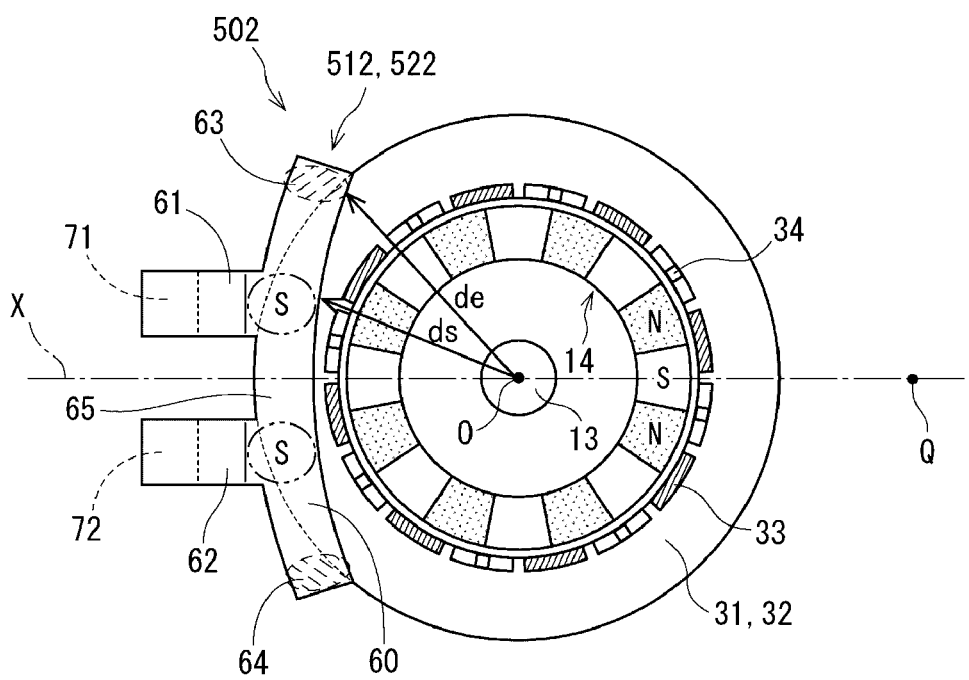
FIG. 7 is a plan view of a magnetic sensor module according to a second embodiment.

As illustrated in FIG. 7, in the magnetic sensor module 502 according to the second embodiment, each of main bodies of the magnetic flux guide members 512 and 522 has a strip shape, the opposite sides of which are concentric arcs symmetrical with respect to the reference line X in the plan view. The concentric arcs have a point Q on the reference line X as the center thereof on the opposite side of magnetic sensors 71 and 72 with respect to the central axis O, having curvature smaller than that of the arc having its center at the central axis O. As in the case with the first embodiment, a distance ds from either of S portions, which are locations in each of the main bodies 60 from which extensions 61 and 62 are branched, to the central axis O is shorter than a distance de from either of circumferential end portions 63 and 64 to the central axis O.

Each of the magnetic flux guide members 512 and 522 faces the corresponding one of the yokes 31 and 32 from inside of the yokes 31 and 32 in the axial direction. The gap therebetween is constant. The facing area is relatively large at an intermediate portion 65, which is close to the magnetic sensors 71 and 72, and becomes smaller at locations closer to the circumferential end portions 63 and 64. The locations from which the extensions 61 and 62 are branched have larger facing areas than do the circumferential end portions 63 and 64, thus having greater magnetic permeance between each of the magnetic flux guide members 512 and 522 and the corresponding one of the yokes 31 and 32. Thus, the second embodiment produces an effect of improving the S/N ratio as in the first embodiment. Note that the first embodiment, in which the side of the magnetic flux guide member near the central axis O is a straight line, can be interpreted as a special form of the second embodiment, where the arc has the point Q at infinity, having infinitesimal curvature.

Third Embodiment

Figure 8A:
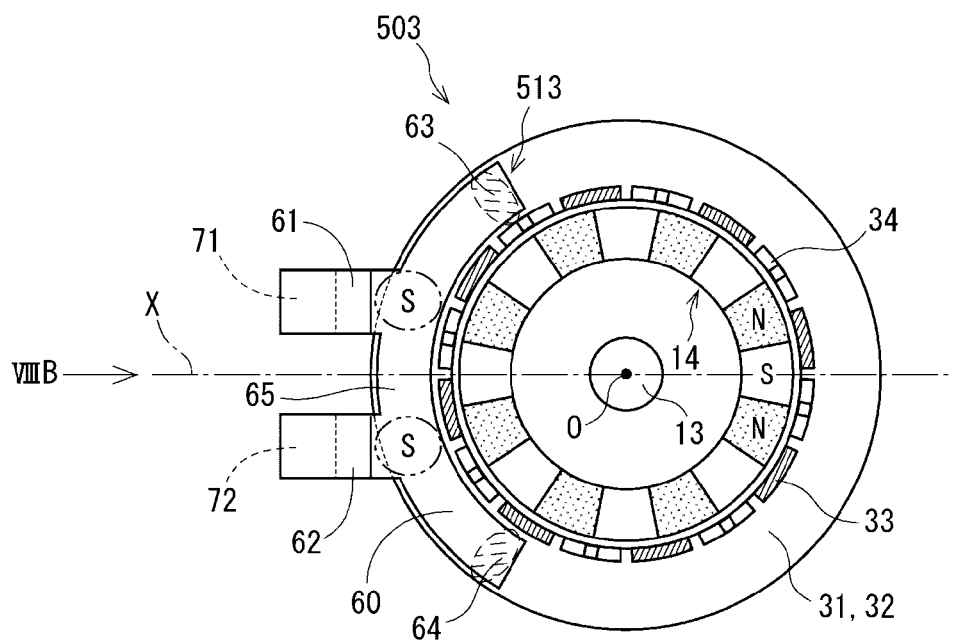
FIG. 8A is a plan view of a magnetic sensor module according to a third embodiment.
Figure 8B:
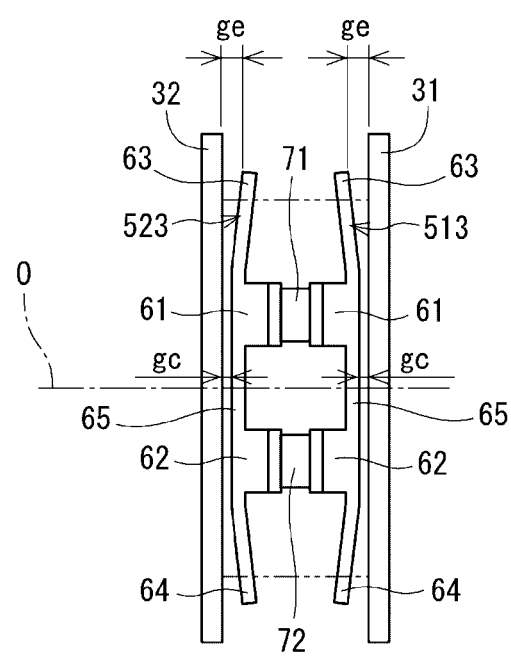
FIG. 8B is a side view of the magnetic sensor module according to the third embodiment.

A magnetic sensor module 503 according to the third embodiment is described with reference to FIG. 4, the drawing for the first embodiment, as its axial-direction sectional view. As illustrated in FIGS. 8A and 8B, in the magnetic sensor module 503 according to the third embodiment, a main body of a magnetic flux guide member 513 has a strip shape, the opposite sides of which are concentric arcs having the center on the central axis O in the plan view. Each of the magnetic flux guide members 513 and 523 faces the corresponding one of the yokes 31 and 32 from inside of the yokes 31 and 32 in the axial direction. The facing area is constant along the circumferential direction of the yokes 31 and 32.

In the side view, each of the magnetic flux guide members 513 and 523 and the corresponding one of the yokes 31 and 32 have a gap therebetween in the axial direction that is relatively small at an intermediate portion 65, which is close to the magnetic sensors 71 and 72, and becomes larger at locations closer to circumferential end portions 63 and 64, from a gap gc at the intermediate portion 65 to gaps ge at the circumferential end portions 63 and 64. Locations from which extensions 61 and 62 are branched have smaller gaps than do the circumferential end portions 63 and 64, thus having greater magnetic permeance between each of the magnetic flux guide members 513 and 523 and the corresponding one of the yokes 31 and 32. Thus, the third embodiment produces an effect of improving the S/N ratio as in the first embodiment.

Fourth Embodiment

Figure 9A:
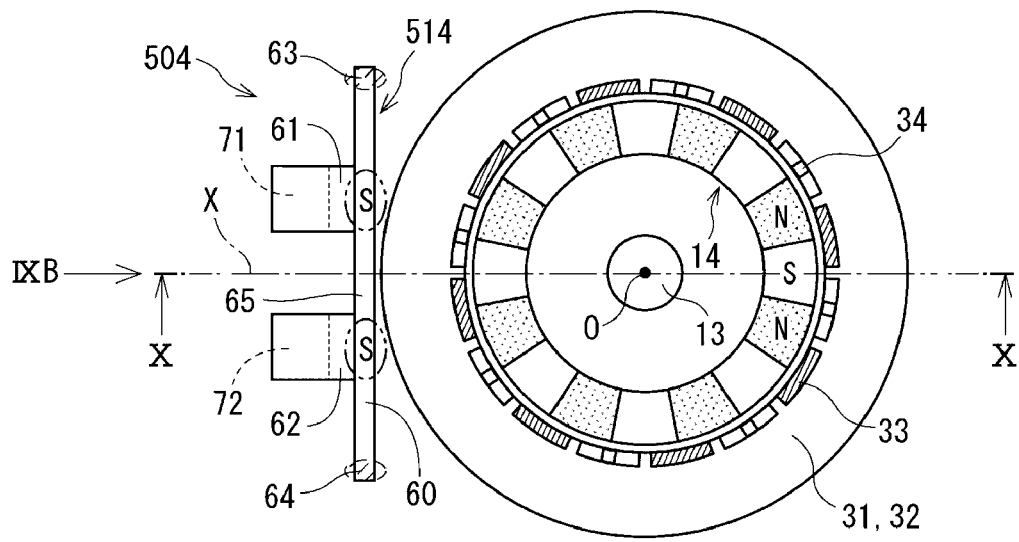
FIG. 9A is a plan view of a magnetic sensor module according to a fourth embodiment.
Figure 9B:
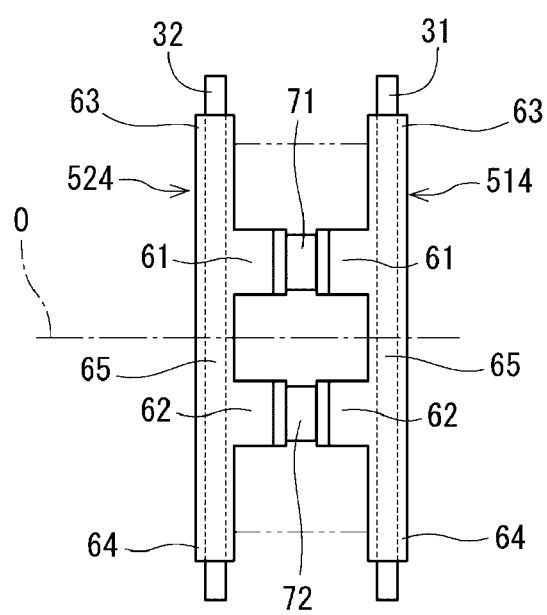
FIG. 9B is a side view of the magnetic sensor module according to the fourth embodiment.
Figure 10:
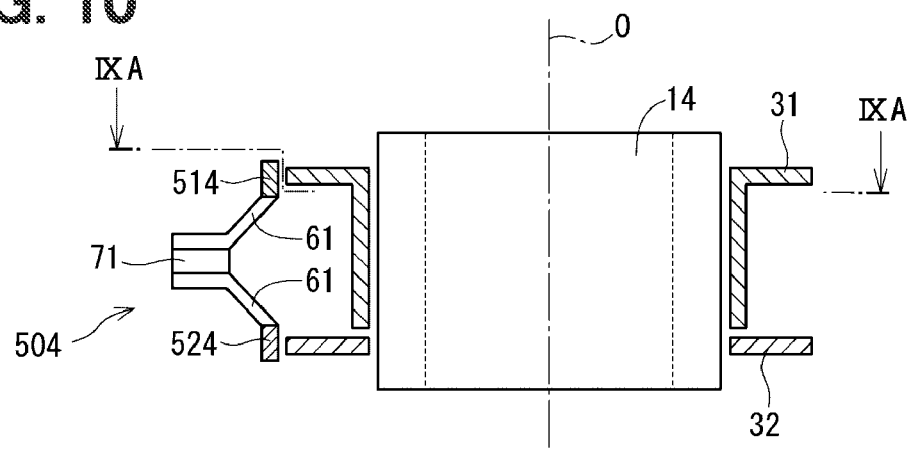
FIG. 10 is an axial-direction sectional view of the magnetic sensor module according to the fourth embodiment.

As illustrated in FIGS. 9A, 9B, and 10, in a magnetic sensor module 504 according to the fourth embodiment, each of main bodies of magnetic flux guide members 514 and 524 is placed outside of the external shapes of yokes 31 and 32 in the radial direction and has a rectangular strip shape symmetrical with respect to the reference line X in the plan view. Each of the magnetic flux guide members 514 and 524 has a side near the central axis O, and this side is a straight line orthogonal to the reference line X. Thus, the fourth embodiment produces effects of reducing the size and improving manufacturing yield as in the first embodiment.

In the side view and axial-direction sectional view, each of the magnetic flux guide members 514 and 524 faces a side surface of the corresponding one of the yokes 31 and 32 in the radial direction. A portion of each of the magnetic flux guide members 514 and 524 that faces the corresponding one of the yokes 31 and 32 has a constant height in the axial direction. Each of the magnetic flux guide members 514 and 524 and the corresponding one of the yokes 31 and 32 have a gas therebetween in the radial direction that is relatively small at an intermediate portion 65, which is close to magnetic sensors 71 and 72, and becomes larger at locations closer to circumferential end portions 63 and 64. Locations from which extensions 61 and 62 are branched have smaller gaps than do the circumferential end portions 63 and 64, thus having greater magnetic permeance between each of the magnetic flux guide members 514 and 524 and the corresponding one of the yokes 31 and 32. Thus, the fourth embodiment produces an effect of improving the S/N ratio as in the first embodiment.

Fifth and Sixth Embodiments

Figure 11:
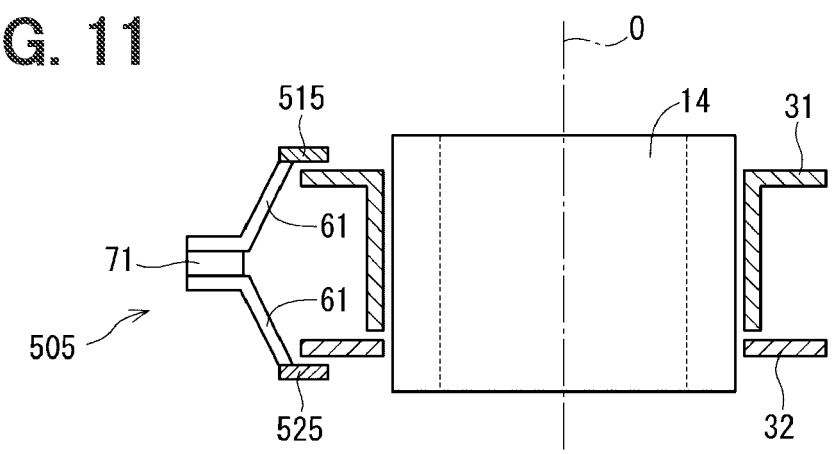
FIG. 11 is an axial-direction sectional view of a magnetic sensor module according to a fifth embodiment.
Figure 12:
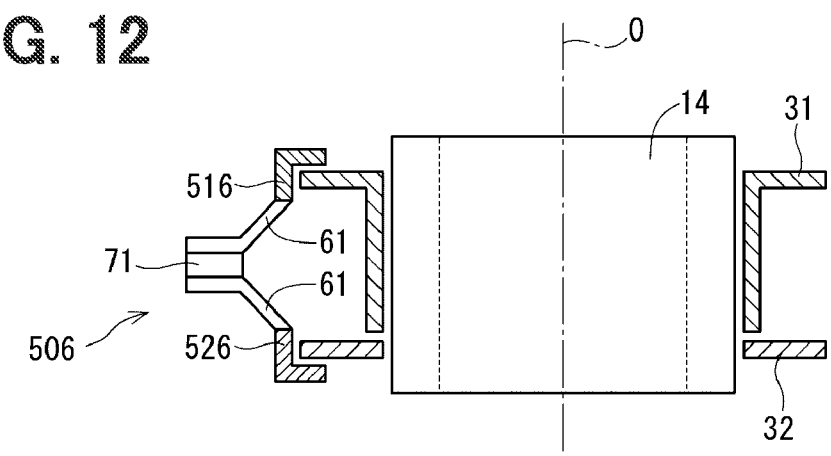
FIG. 12 is an axial-direction sectional view of a magnetic sensor module according to a sixth embodiment.

FIG. 11 is an axial-direction sectional view of a magnetic sensor module 505 according to the fifth embodiment, and FIG. 12 is an axial-direction sectional view of a magnetic sensor module 506 according to the sixth embodiment. The fifth and sixth embodiments are other variations of how the magnetic flux guide member faces the yoke. Each of main bodies of magnetic flux guide members 515 and 525 according to the fifth embodiment and that of magnetic flux guide members 516 and 526 according to the sixth embodiment may have a rectangular strip shape in the plan view as in the first or fourth embodiment, or a strip shape whose opposite sides are arcs in the plan view as in the second embodiment.

Each of the magnetic flux guide members 511 and 521 according to the first embodiment faces the surface of the ring portion of the corresponding one of the yokes 31 and 32 from inside of the yokes 31 and 32 in the axial direction. In contrast, as illustrated in FIG. 11, each of the magnetic flux guide members 515 and 525 according to the fifth embodiment is placed outside of yokes 31 and 32 in the axial direction and faces a surface of a ring portion of the corresponding one of the yokes 31 and 32 from outside of the yokes 31 and 32 in the axial direction. As illustrated in FIG. 12, each of the magnetic flux guide members 516 and 526 according to the sixth embodiment faces a surface of a ring portion of a corresponding one of yokes 31 and 32 from outside of the yokes 31 and 32 in the axial direction as well as a side surface of the corresponding one of the yokes 31 and 32 in the radial direction. As described above, each of magnetic flux guide members in each embodiment may face the corresponding one of the yokes 31 and 32 in the axial direction, radial direction, or a combination of both directions as appropriate.

Seventh Embodiment

Figure 13A:
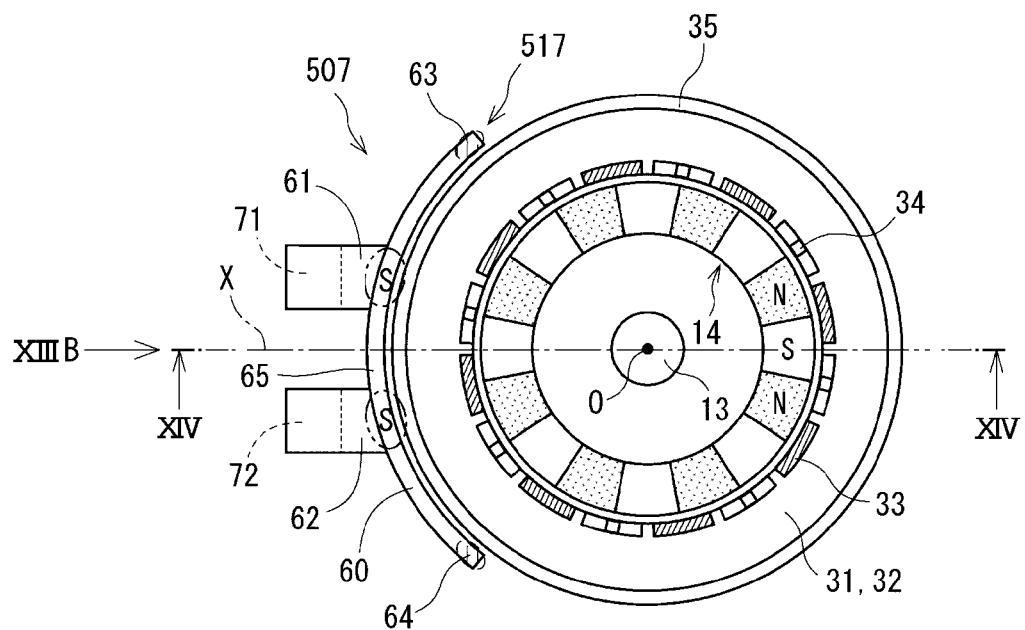
FIG. 13A is a plan view of a magnetic sensor module and yokes according to a seventh embodiment.
Figure 13B:
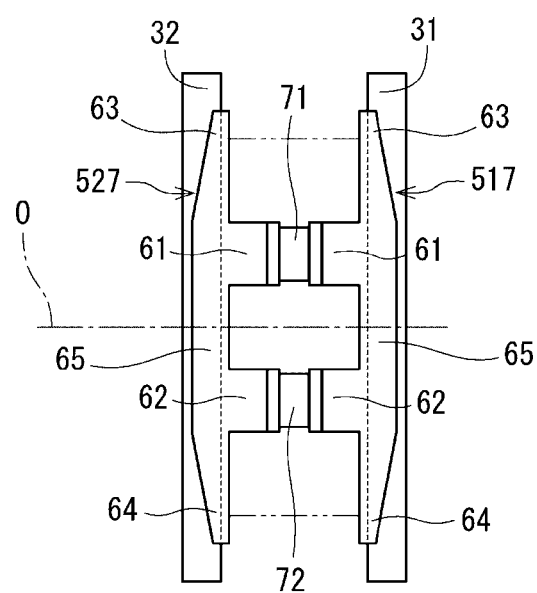
FIG. 13B is a side view of the magnetic sensor module and the yokes according to the seventh embodiment.
Figure 14:
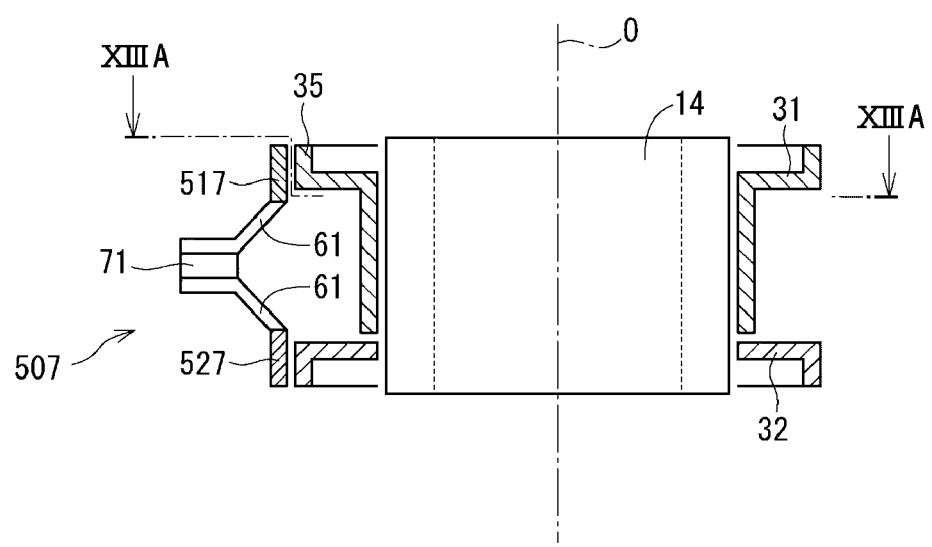
FIG. 14 is an axial-direction sectional view of the magnetic sensor module and the yokes according to the seventh embodiment.

As illustrated in FIGS. 13A, 13B, and 14, in a magnetic sensor module 507 according to the seventh embodiment, each of main bodies of magnetic flux guide members 517 and 527 is placed outside of the external shapes of yokes 31 and 32 in the radial direction and has a strip shape, the opposite sides of which are concentric arcs having the center on the central axis O in the plan view.

In the side view and axial-direction sectional view, each of the yokes 31 and 32 has a wall portion 35 on a corresponding circumferential edge portion to have an increased height in the axial direction. Each of the yokes 31 and 32 may simply have an increased thickness in place of the wall portion 35. Each of the magnetic flux guide members 517 and 527 faces a side surface of the corresponding one of the yokes 31 and 32 in the radial direction with a constant gap therebetween in the radial direction. Each of the main bodies of the magnetic flux guide members 517 and 527 has a height in the axial direction that is relatively great at an intermediate portion 65, which is close to magnetic sensors 71 and 72, and becomes smaller at locations closer to circumferential end portions 63 and 64. Thus, the facing area where each of the magnetic flux guide members 517 and 527 faces the corresponding one of the yokes 31 and 32 is relatively large at the intermediate portion 65 and becomes smaller at locations closer to the circumferential end portions 63 and 64. Locations from which extensions 61 and 62 are branched (S portions) have larger facing areas than do the circumferential end portions 63 and 64, thus having greater magnetic permeance between each of the magnetic flux guide members 517 and 527 and the corresponding one of the yokes 31 and 32. Thus, the seventh embodiment produces an effect of improving the S/N ratio as in the first embodiment.

Eighth Embodiment

Figure 15A:
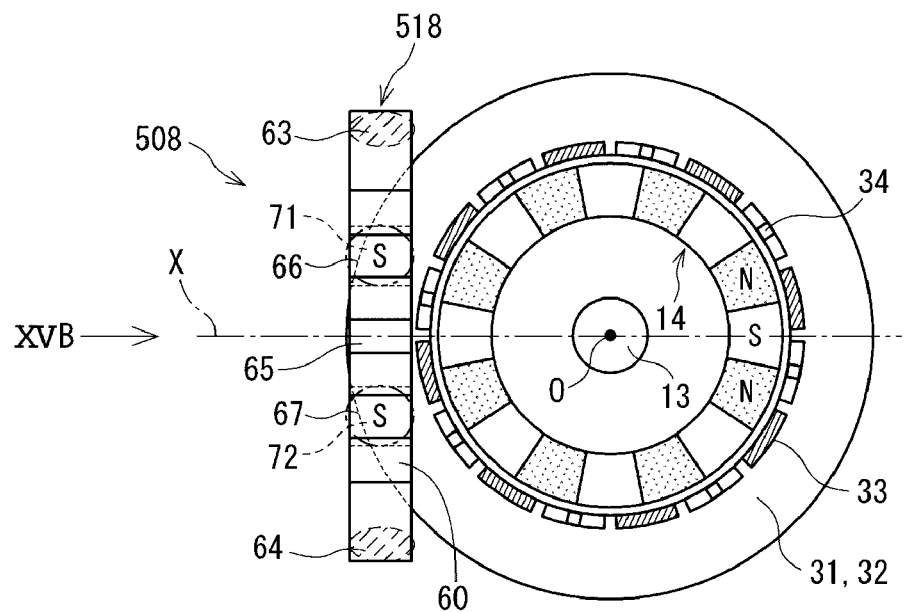
FIG. 15A is a plan view of a magnetic sensor module according to an eighth embodiment.
Figure 15B:
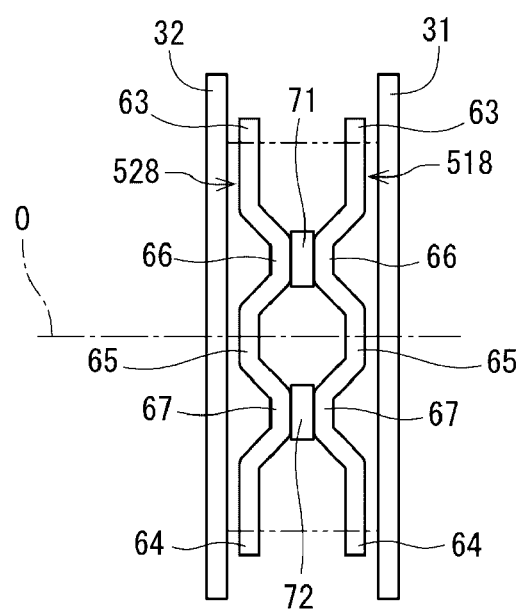
FIG. 15B is a side view of the magnetic sensor module according to the eighth embodiment.

The axial-direction sectional view is omitted for a magnetic sensor module 508 according to the eighth embodiment. As illustrated in FIGS. 15A and 15B, in the magnetic sensor module 506 according to the eighth embodiment, each of magnetic flux guide members 518 and 528 is configured using only a main body having a rectangular strip shape, including no extensions 61 and 62. The magnetic flux guide members 518 and 528 are each bent at sensor holding portions 66 and 67 so as to become closer to each other in the axial direction. A magnetic sensor 71 is placed between the sensor holding portions 66, and a magnetic sensor 72 is placed between the sensor holding portions 67. In this embodiment, the portions of the main bodies 60 at which the magnetic sensors 71 and 72 are placed substantially correspond to "the proximity to the magnetic sensors 71 and 72." Thus, the eighth embodiment produces an effect of improving the S/N ratio as in the first embodiment and is capable of reducing the size of the magnetic sensor module 506.

Ninth Embodiment

Figure 16:
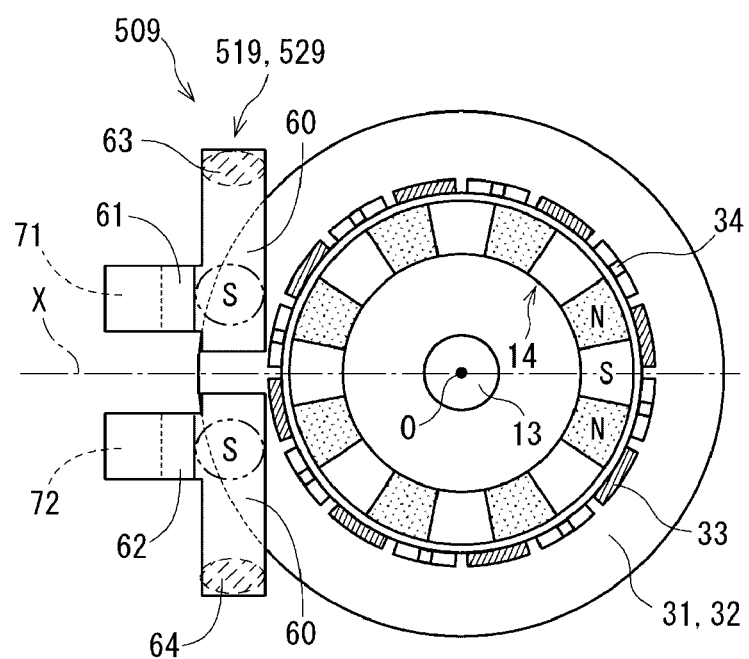
FIG. 16 is a plan view of a magnetic sensor module according to a ninth embodiment.

The side view and axial-direction sectional view are omitted for a magnetic sensor module 509 according to the ninth embodiment. In the plan view provided in FIG. 16, magnetic flux guide members, including a lower magnetic flux guide member, are designated with signs "519, 529." As illustrated in FIG. 16, in the magnetic sensor module 509 according to the ninth embodiment, each of the magnetic flux guide members 519 and 529 is divided into one portion on one side and the other portion on the other side with respect to the reference line X. The ninth embodiment is similar to the first embodiment in the other features. The ninth embodiment is capable of further improving the manufacturing yield of the magnetic flux guide members by omitting the intermediate portion 65, as well as producing the effects of the first embodiment. The ninth embodiment is based on a premise that two magnetic sensors 71 and 72, or an even number of four or more magnetic sensors, are disposed symmetrically with respect to the reference line X.

Tenth Embodiment

Figure 17A:
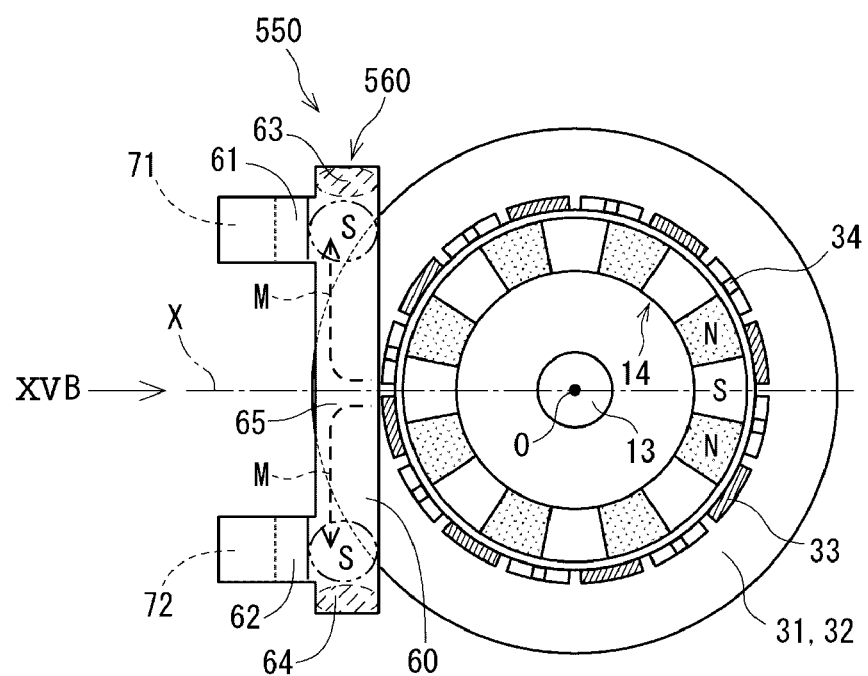
FIG. 17A is a plan view of a magnetic sensor module according to a tenth embodiment.
Figure 17B:
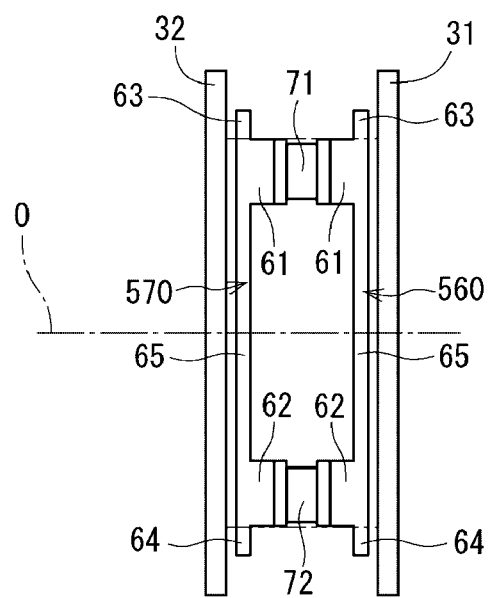
FIG. 17B is a side view of the magnetic sensor module according to the tenth embodiment.

A magnetic sensor module 510 according to the tenth embodiment is described with reference to FIG. 4, the drawing for the first embodiment, as its axial-direction sectional view. As illustrated in FIGS. 17A and 17B, magnetic flux guide members 560 and 570 in the magnetic sensor module 550 according to the tenth embodiment are different from the magnetic flux guide members 511 and 521 according to the first embodiment in that extensions 61 and 62 are placed near circumferential end portions 63 and 64, respectively. This means that, in the tenth embodiment, the facing area where each of the magnetic flux guide members 560 and 570 faces a corresponding one of yokes 31 and 32 is smaller at S portions that are locations from which the extensions 61 and 62 are branched than that at an intermediate portion 65. No extensions may be provided, in which case, magnetic sensors 71 and 72 are placed directly at main bodies 60, as in the eighth embodiment.

Figure 18:
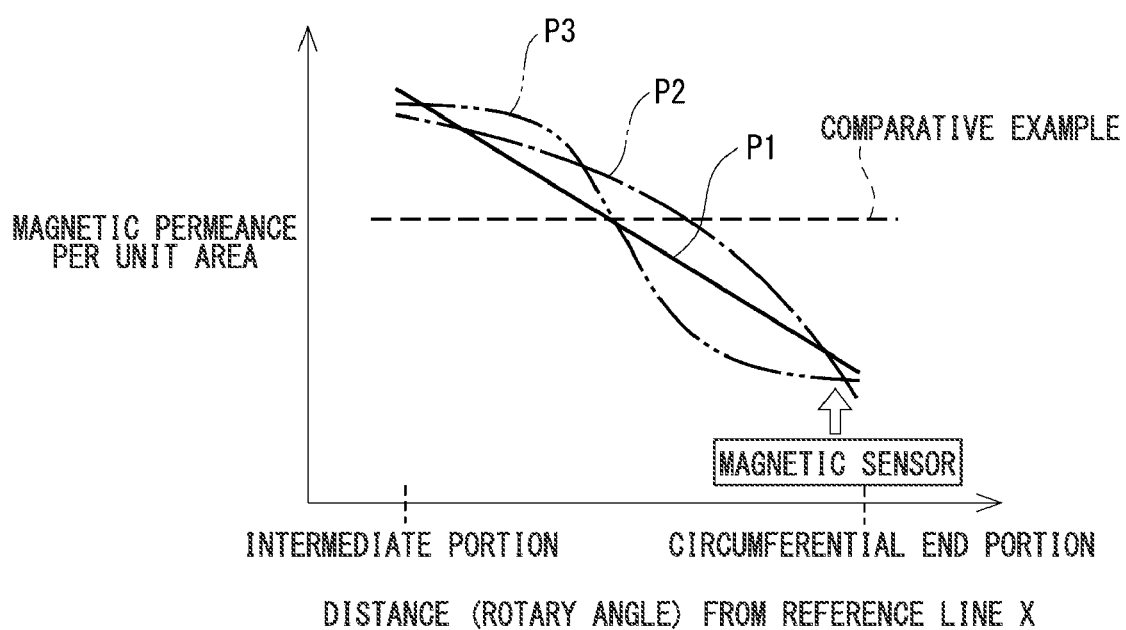
FIG. 18 is a correlation diagram between distance from the reference line and magnetic permeance in the tenth embodiment.

As illustrated in FIG. 18, which corresponds to FIG. 5A, the magnetic sensors 71 and 72 are placed near the circumferential end portions 63 and 64 in the tenth embodiment in the correlation diagram between a distance or rotary angle from the reference line X and magnetic permeance. Thus, each of the magnetic flux guide members 560 and 570 according to the tenth embodiment is configured to allow the magnetic permeance between each of the magnetic flux guide members 560 and 570 and the corresponding one of the yokes 31 and 32 to be smaller at the S portions, which are locations in the corresponding main body 60 from which the extensions 61 and 62 are branched, than at a location on the reference line X. Furthermore, the tenth embodiment and the first embodiment have commonality in that their characteristics are different from that of the comparative example where the "magnetic permeance between the magnetic flux guide member and the yoke is independent of the relative radial and angular position," i.e., the magnetic permeance is constant regardless of the distance from the reference line X.

The tenth embodiment does not have an effect of increasing the signal that the first embodiment produces to improve the S/N ratio. In the tenth embodiment, however, magnetic flux guided from the yokes 31 and 32 bifurcates toward the two magnetic sensors 71 and 72 from the location of the reference line X, as indicated with broken line arrows M. Propagating whirling noise can thus be reduced. Thus, the S/N ratio of the magnetic flux detected by the magnetic sensors 71 and 72 can be also improved in the tenth embodiment. The tenth embodiment is based on a premise that an even number of two or more magnetic sensors are disposed symmetrically with respect to the reference line X as in the ninth embodiment for reasons of the characteristics described above.

Eleventh and Twelfth Embodiments

While two magnetic sensors 71 and 72 are provided in the first to tenth embodiments described above, a single magnetic sensor may be provided on the reference line X in a magnetic sensor module. Embodiments in which a single magnetic sensor is used in the first and eighth embodiments are described below as the eleventh and twelfth embodiments.

The side view and axial-direction sectional view are omitted for a magnetic sensor module 551 according to the eleventh embodiment. In the plan view provided in FIG. 19, magnetic flux guide members, including a lower magnetic flux guide member, are designated with signs "561, 571." As illustrated in FIG. 19, the magnetic flux guide members 561 and 571 are different from the magnetic flux guide members 511 and 521 according to the first embodiment in that an extension 61 each is provided, corresponding to a magnetic sensor 71 used singly.

Figure 20:
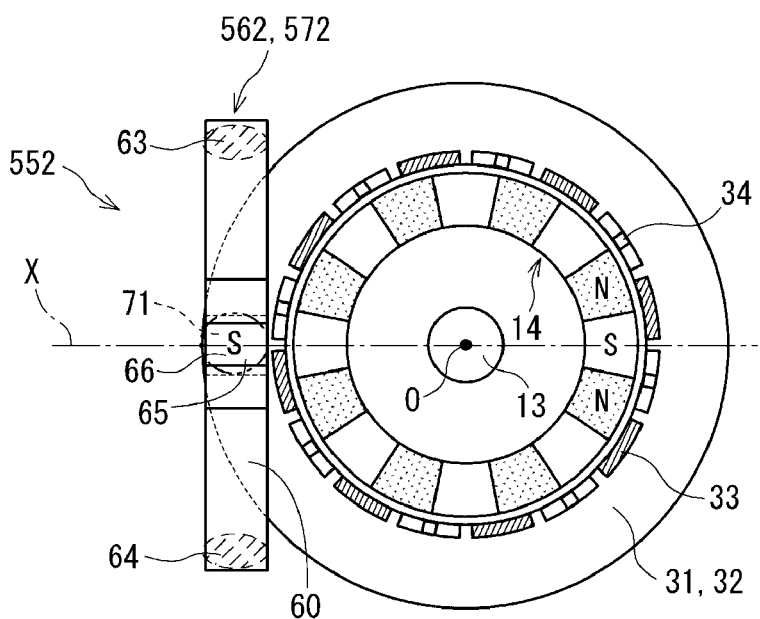
FIG. 20 is a plan view of a magnetic sensor module according to a twelfth embodiment.

The side view and axial-direction sectional view are omitted for a magnetic sensor module 552 according to the twelfth embodiment. In the plan view provided in FIG. 20, magnetic flux guide members, including a lower magnetic flux guide member, are designated with signs "562, 572." As illustrated in FIG. 20, the magnetic flux guide members 562 and 572 are different from the magnetic flux guide members 518 and 528 according to the eighth embodiment in that a sensor holding portion 66 each is provided, corresponding to a magnetic sensor 71 used singly.

As described above, the number of magnetic sensors used in a magnetic sensor module in each embodiment may be one, two, three, or more, except for the ninth and tenth embodiments that are based on a premise that two magnetic sensors 71 and 72 are included. The number of extensions or sensor holding portions used in the magnetic flux guide member may be adjusted depending on the number of magnetic sensors used therein.

Thirteenth Embodiment

Figure 21A:
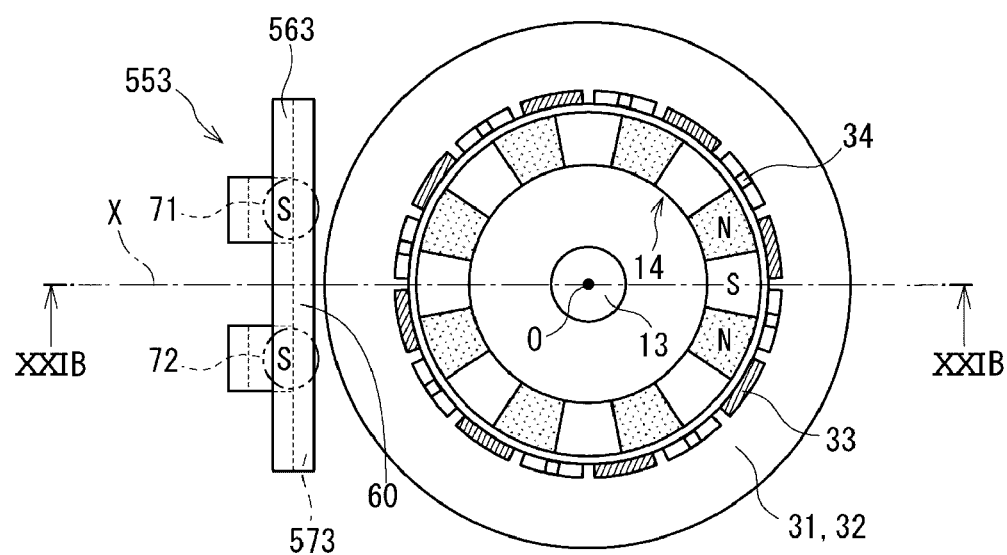
FIG. 21A is a plan view of a magnetic sensor module according to a thirteenth embodiment.
Figure 21B:
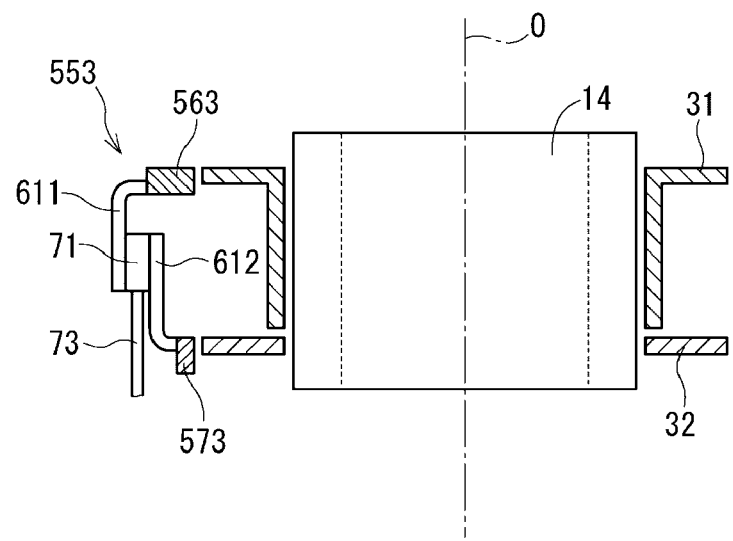
FIG. 21B is an axial-direction sectional view of the magnetic sensor module according to the thirteenth embodiment.
Figure 22A:
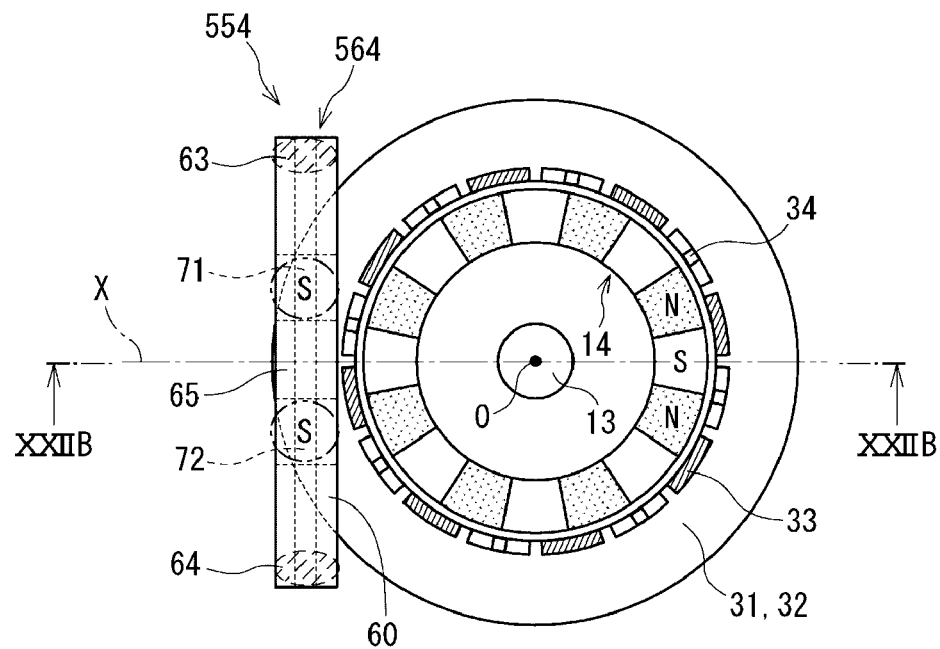
FIG. 22A is a plan view of a magnetic sensor module according to a fourteenth embodiment.
Figure 22B:
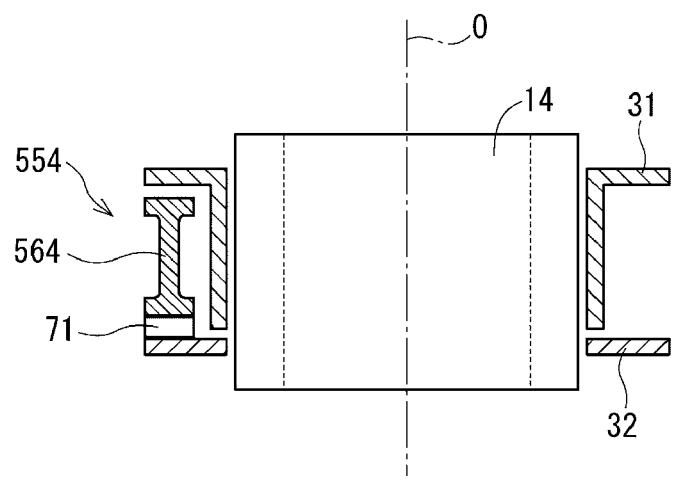
FIG. 22B is an axial-direction sectional view of the magnetic sensor module according to the fourteenth embodiment.

In any of the embodiments described above, each of the magnetic sensors 71 and 72 is placed with the wider surfaces of the IC package having a substantially rectangular parallelepiped shape placed orthogonal to an axis (a horizontal orientation). In a magnetic sensor module 553 according to the thirteenth embodiment illustrated in FIGS. 21A and 21B, each of magnetic sensors 71 and 72 is placed with the wider surfaces of the IC package having a substantially rectangular parallelepiped shape placed parallel with the axis (a vertical orientation). In FIG. 21A, the signs and hatching for circumferential end portions 63 and 64 are omitted.

For example, each of main bodies of magnetic flux guide members 563 and 573 is placed outside of the external shapes of yokes 31 and 32 in the radial direction and has a rectangular strip shape symmetrical with respect to the reference line X in the plan view, facing the corresponding one of the yokes 31 and 32, as in the fourth embodiment. An extension 611 extending from the upper magnetic flux guide member 563 and bent downward holds a radially outer portion of the magnetic sensor 71. An extension 612 extending from the lower magnetic flux guide member 573 and bent upward holds a radially inner portion of the magnetic sensor 71. The thirteenth embodiment is effective when, for example, it is desired that a lead 73 is drawn in the axial direction. The thirteenth embodiment can be also applied to a configuration using a single magnetic sensor.

Fourteenth Embodiment

In any of the embodiments described above, the magnetic flux guide members are used in a pair, each facing one of the yokes provided in a pair. In a magnetic sensor module 554 according to the fourteenth embodiment illustrated in FIGS. 22A and 22B, a magnetic flux guide member is provided for one of the yokes but not for the other yoke. For example, a magnetic flux guide member 564 is placed between yokes 31 and 32 in the axial direction, with an upper end portion of the magnetic flux guide member 564 facing the upper yoke 31. The magnetic sensor 71 is placed between a lower end portion of the magnetic flux guide member 564 and the lower yoke 32. This means that magnetic flux is transmitted from the lower yoke 32 directly to a lower surface of the magnetic sensor 71 without using a magnetic flux guide member. As described above, magnetic flux guide members do not necessarily need to be provided in a pair, each facing one of yokes provided in a pair. The fourteenth embodiment can be also applied to a configuration using a single magnetic sensor.

[Relationship Between Length of Main Body of Magnetic Flux Guide Member and Whirling Noise]

As described above with reference to FIG. 5B, the magnetic flux reaching the magnetic flux guide members 511 and 521 spreads out from the intermediate portion 65 toward the circumferential end portions 63 and 64, thereby reducing the whirling noise. A condition on the length of the main body of the magnetic flux guide member for optimizing the reduction of whirling noise is described next with reference to FIGS. 23 to 27. It is assumed first that the number of magnetic poles of the multipolar magnet 14 is 16. An optimum condition for the length of each of the main bodies 60 of the magnetic flux guide members 51 and 52 is discussed here in terms of correspondence with the number of magnetic poles of the multipolar magnet 14. The configuration used for the discussion includes two magnetic sensors 71 and 72 with the extensions 61 and 62 placed toward the intermediate portion 65 of the main body 60.

The shape of each of the main bodies 60 of the magnetic flux guide members 51 and 52 assumed here is "a rectangular strip shape whose longitudinal side is orthogonal to the reference line X in the magnetic flux guide members 511 and 521" according to the first embodiment and "a strip shape whose opposite sides are concentric arcs in the magnetic flux guide members 513 and 523" according to the third embodiment. In either case, the main body 60 is symmetrical with respect to the reference line X. The shape of each of the main bodies of the magnetic flux guide members 511 and 521 in the first embodiment is hereinafter referred to simply as a "straight line shape," and that of the magnetic flux guide members 513 and 523 in the third embodiment as an "arc shape."

Figure 23:
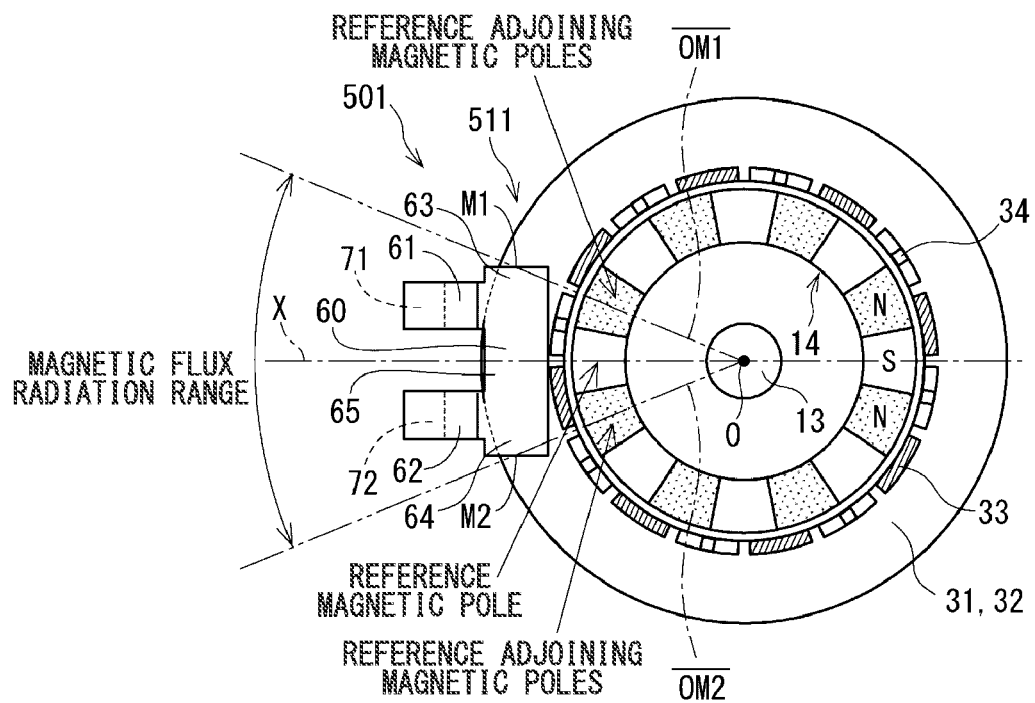
FIG. 23 is a diagram illustrating a preferable length of the main body of the magnetic flux guide member having a straight line shape according to the first embodiment.
Figure 24:
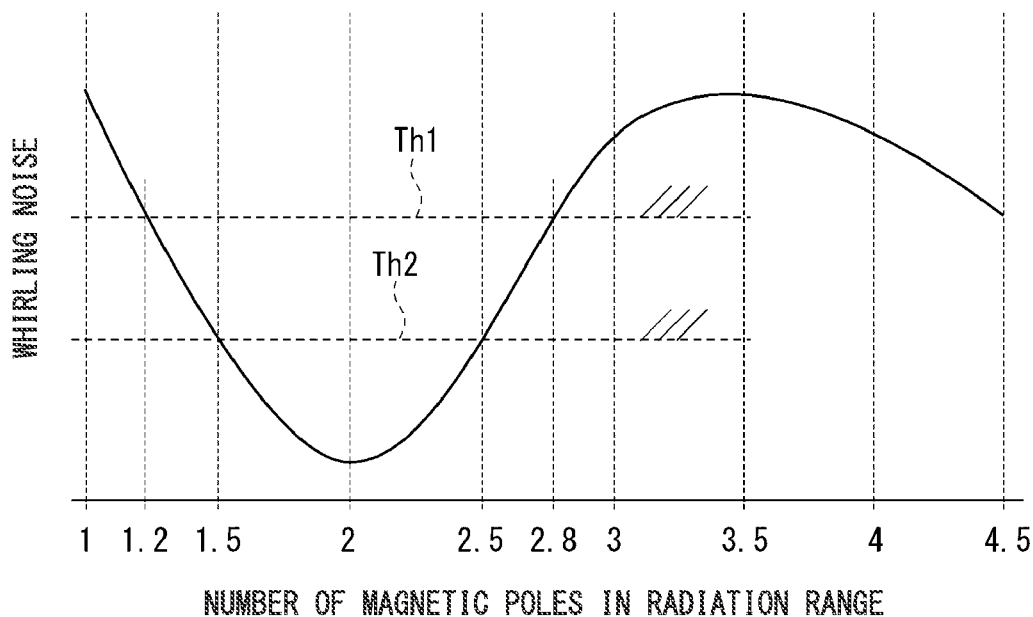
FIG. 24 is a diagram for describing a relationship between the number of magnetic poles in the radiation range in the magnetic flux guide member having the straight line shape and whirling noise.

FIG. 23 is a plan view corresponding to FIG. 3A provided for the first embodiment. In the projection view of the yokes 31 and 32 in the axial direction, a straight line OM1 connecting the central axis O of the multipolar magnet 14 to an arbitrary point M1 at the circumferential end portion 63 and a straight line OM2 connecting the central axis O to an arbitrary point M2 at the circumferential end portion 64 define a range in the circumferential direction referred to as "magnetic flux radiation range." In FIG. 23, the S-pole on the reference line X toward the magnetic flux guide members 511 and 521 is referred to as "reference magnetic pole," and the two N-poles next to the reference magnetic pole on both sides thereof are referred to as "reference adjoining magnetic poles." In an example illustrated in FIG. 23, each of the straight lines OM1 and OM2 passes through the center of the corresponding one of the reference adjoining magnetic poles. Thus, the number of magnetic poles of the multipolar magnet 14 included in the magnetic flux radiation range is two. In the drawing, the straight lines OM1 and OM2 are respectively denoted with "OM1" and "OM2" with a horizontal bar above them.

The length of each of the main bodies 60, in a direction orthogonal to the reference line X, of the magnetic flux guide members 511 and 521 having the straight line shape is expressed in terms of "the number of magnetic poles of the multipolar magnet included in the magnetic flux radiation range" (hereinafter referred to as "the number of magnetic poles in the radiation range"). A relationship obtained through simulation between the number of magnetic poles in the radiation range and the whirling noise is presented in FIG. 24. The whirling noise decreases as the number of magnetic poles in the radiation range increases from one, reaches a minimum at about 2.0 poles, and increases as the number of magnetic poles in the radiation range increases from two to three.

With an allowable threshold value for whirling noise set to Th1, the whirling noise drops below the allowable threshold value Th1 when the number of magnetic poles in the radiation range is in a range of 1.2 to 2.8. Thus, the length of each of the main bodies 60 of the magnetic flux guide members 511 and 521 is preferably set so as to cause the number of magnetic poles in the radiation range to be in a range of 1.2 to 2.8.

With an allowable threshold value for whirling noise set to Th2, which is lower than Th1, the whirling noise drops below the allowable threshold value Th2 when the number of magnetic poles in the radiation range is in a range of 1.5 to 2.5. Thus, an increased effect of reducing the whirling noise is obtained when the number of magnetic poles in the radiation range is in a range of 1.5 to 2.5. The effect of reducing the whirling noise is maximized when the number of magnetic poles in the radiation range is 2.0.

Figure 25:
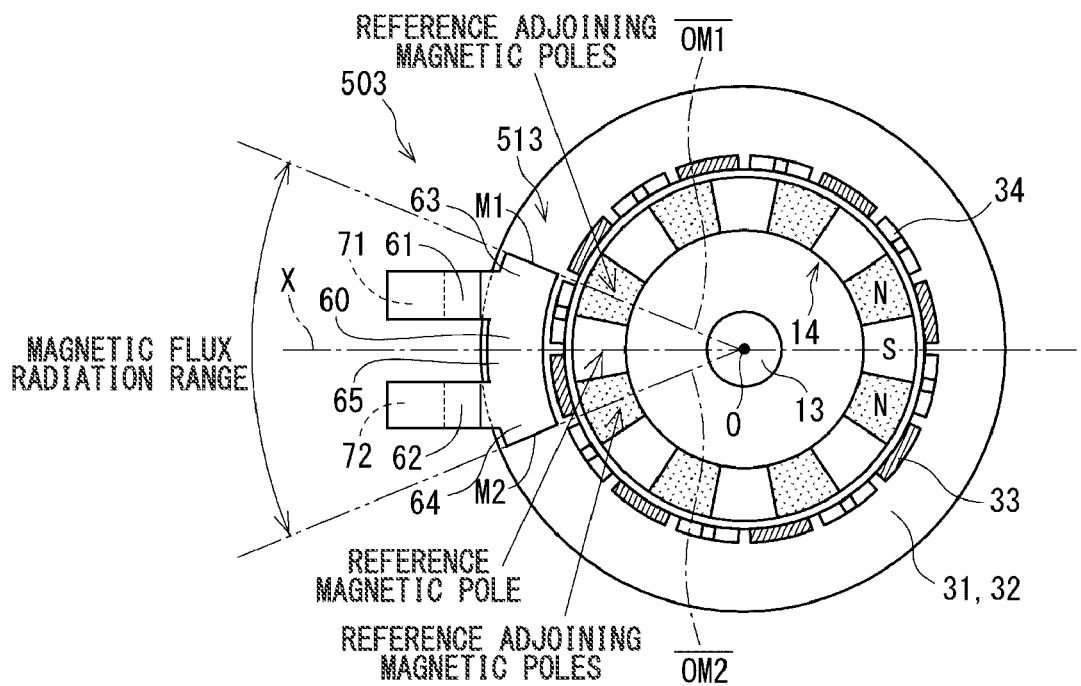
FIG. 25 is a diagram illustrating a preferable length of the main body of the magnetic flux guide member having an arc shape according to the third embodiment.
Figure 26:
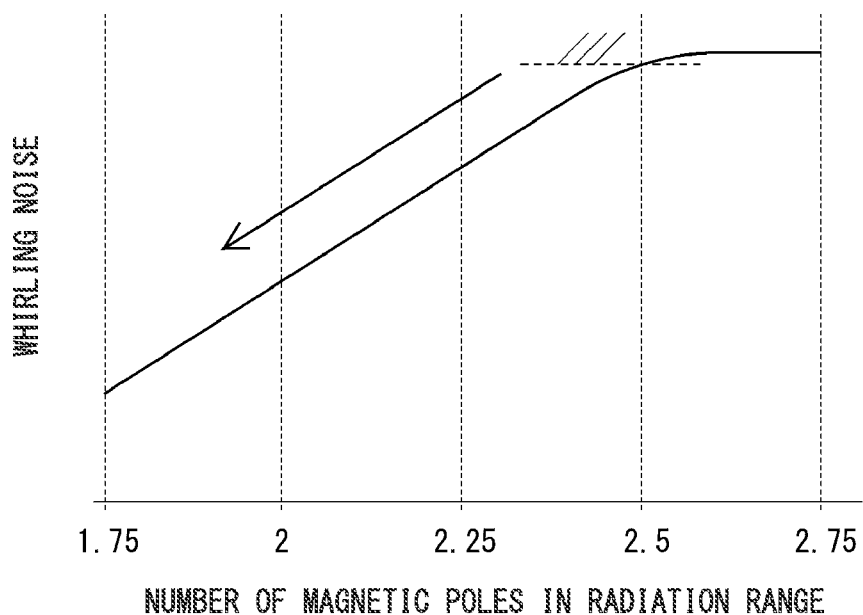
FIG. 26 is a diagram for describing a relationship between the number of magnetic poles in the radiation range in the magnetic flux guide member having the arc shape and whirling noise.

FIG. 25 is a plan view corresponding to FIG. 8A provided for the third embodiment. For the terms and comments on the drawing, FIG. 23 is referenced. In an example illustrated in FIG. 25, each of the straight lines OM1 and OM2 passes through the center of the corresponding one of reference adjoining magnetic poles and the number of magnetic poles of the multipolar magnet 14 included in the magnetic flux radiation range is two, as in FIG. 23. The length of each of the main bodies 60, in the circumferential direction, of the magnetic flux guide members 513 and 523 having the arc shape is expressed in terms of the number of magnetic poles in the radiation range. A relationship obtained through simulation between the number of magnetic poles in the radiation range and the whirling noise is presented in FIG. 26.

The whirling noise reaches a maximum when the number of magnetic poles in the radiation range is in a range of 2.5 or more and reduces monotonously as the number of magnetic poles in the radiation range decreases in a range of less than 2.5. Thus, the length of each of the main bodies 60 of the magnetic flux guide members 513 and 523 in the circumferential direction is preferably set so as to cause the number of magnetic poles in the radiation range to be less than 2.5.

Figure 27A:
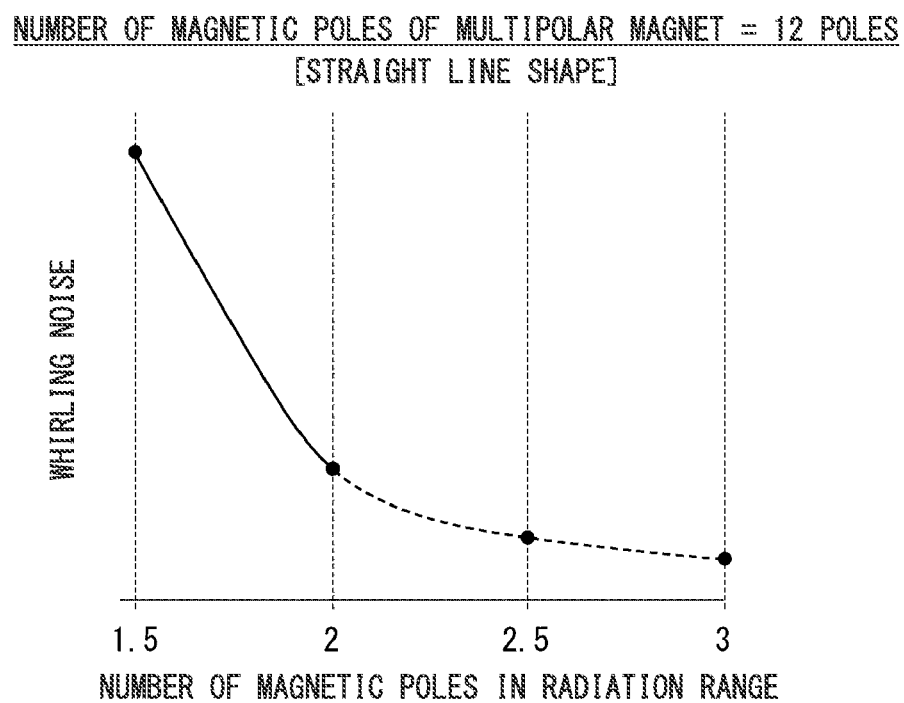
FIG. 27A is a diagram for describing a relationship between the number of magnetic poles in the radiation range and whirling noise when the number of magnetic poles of the multipolar magnet is 12.
Figure 27B:
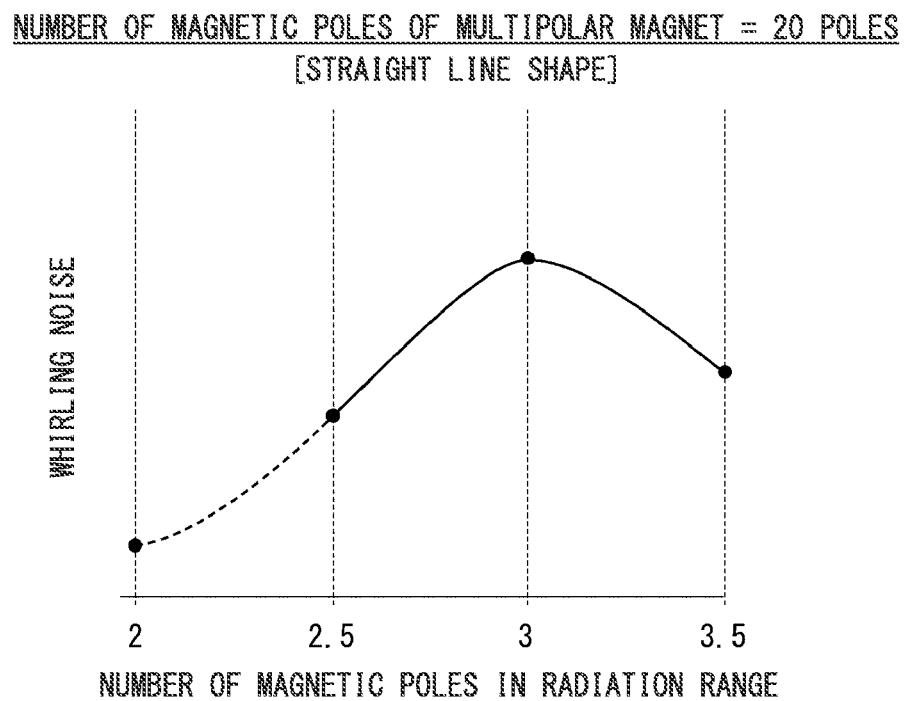
FIG. 27B is a diagram for describing a relationship between the number of magnetic poles in the radiation range and whirling noise when the number of magnetic poles of the multipolar magnet is 20.

FIGS. 27A and 27B present simulation results obtained using the magnetic flux guide members 511 and 521 having the straight line shape when the number of magnetic poles of the multipolar magnet is other than 16. As indicated in FIG. 27A, when the number of magnetic poles of the multipolar magnet is 12, the whirling noise is at decreased levels when the number of magnetic poles in the radiation range indicated with a broken line is in a range of about 2.0 or more. Note that this is because the magnetic flux guide members 511 and 521 and the yokes 31 and 32 have longer distances therebetween, less affected by magnetic flux. The tendency of the whirling noise decreasing rapidly as the number of magnetic poles in the radiation range increases in a range of 1.5 to 2.0 agrees with that in the case of 16 magnetic poles.

As indicated in FIG. 27B, where the number of magnetic poles of the multipolar magnet is 20 and it is assumed that the magnetic sensors 71 and 72 of the equivalent size are used, a feasible shape is unavailable for the magnetic flux guide members 511 and 521 when the number of magnetic poles in the radiation range is in a range of 2.5 or less. If, however, it is assumed that the magnetic sensors of a smaller size are used, the whirling noise may decrease as the number of magnetic poles in the radiation range approaches 2.0 in a range of 2.0 to 2.5 as indicated by a broken line, as in the case of 16 magnetic poles.

Therefore, the length of each of the main bodies 60 of the magnetic flux guide members 511 and 521 having the straight line shape preferably corresponds to a range of 1.5 to 2.5 in number of magnetic poles in the radiation range, when the number of magnetic poles of the multipolar magnet is 12 or 20, as in the case of 16.

Other Embodiments (a) In the first embodiment described above, each of the main bodies 60 of the magnetic flux guide members 511 and 521 has a rectangular strip shape symmetrical with respect to the reference line X in the plan view. The four sides of the "rectangular strip shape" are illustrated as straight lines, which are ideal, in drawings such as FIG. 3. The rectangular strip shape may be a shape that substantially takes a rectangular shape as a whole.

Figure 28A:
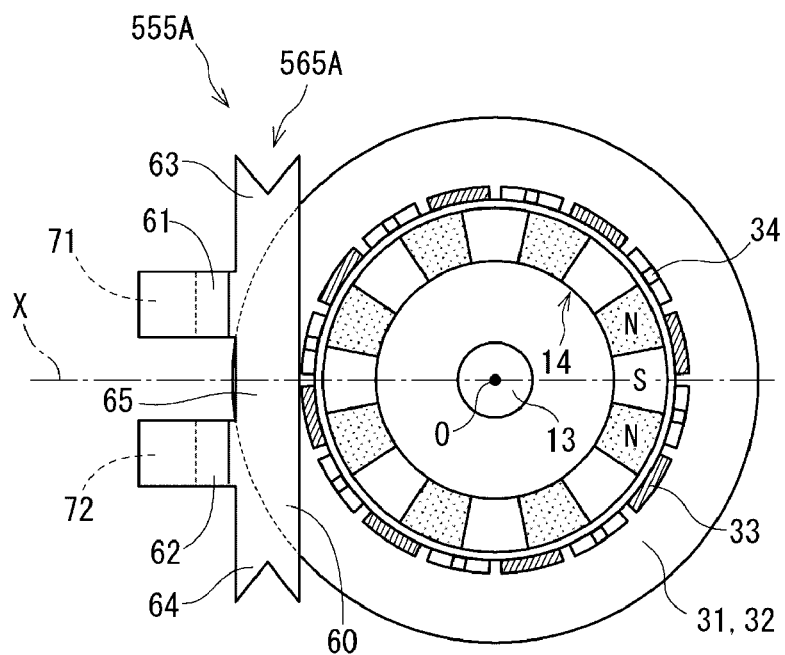
FIG. 28A is a diagram illustrating the shape of a magnetic flux guide member according to another embodiment.
Figure 28B:
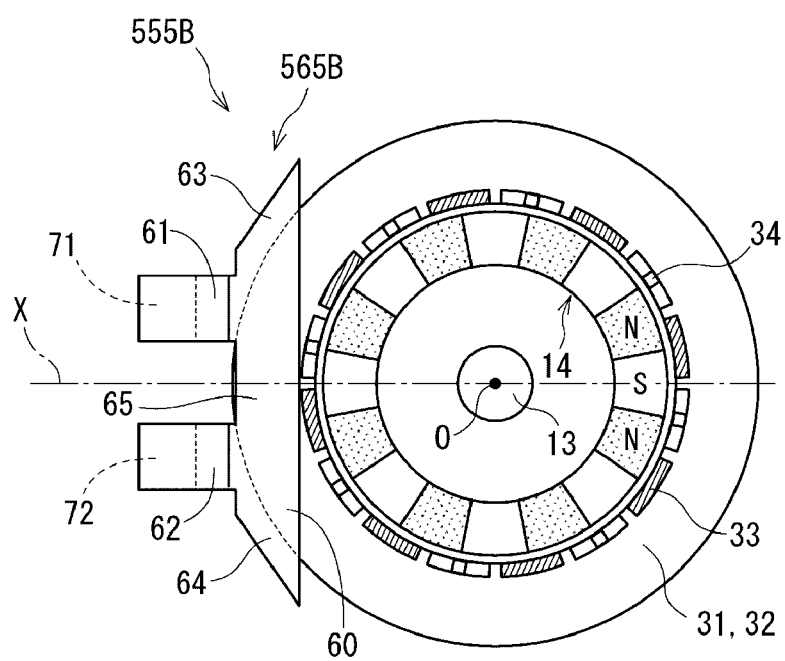
FIG. 28B is a diagram illustrating the shape of a magnetic flux guide member according to another embodiment.

For example, a magnetic flux guide member 565A in a magnetic sensor module 555A illustrated in FIG. 28A has a main body 60 having a substantially V-shaped cutout with a recess oriented toward the reference line X in each of the short sides that configure circumferential end portions 63 and 64. A magnetic flux guide member 565B in a magnetic sensor module 555B illustrated in FIG. 28B has a main body 60 having a trapezoidal shape where the long side on which extensions 61 and 62 are provided is shorter than the long side toward the central axis O of the yokes 31 and 32.

Figure 29A:
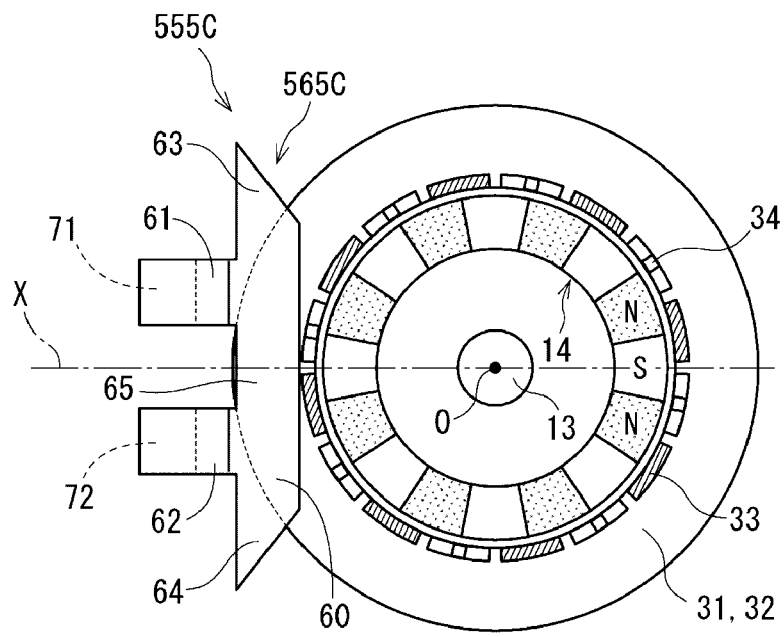
FIG. 29A is a diagram illustrating the shape of a magnetic flux guide member according to another embodiment.
Figure 29B:
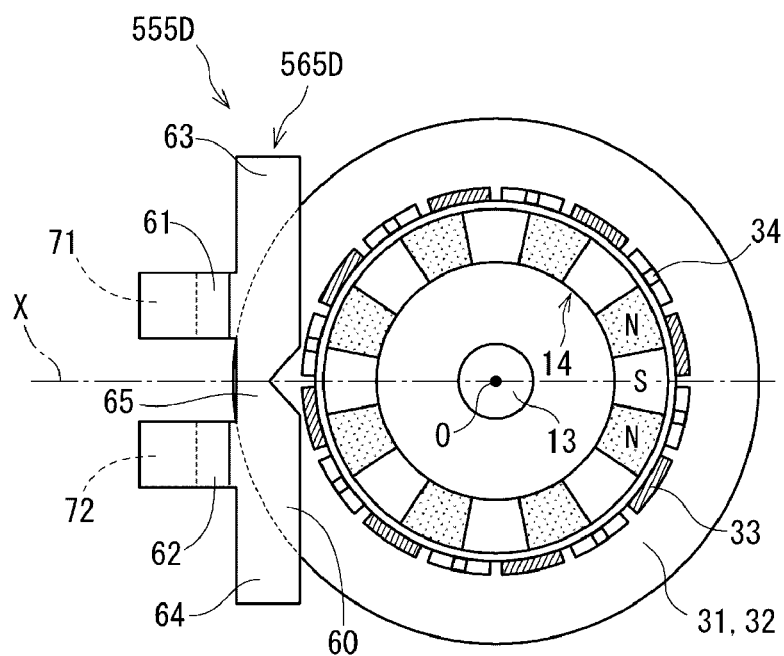
FIG. 29B is a diagram illustrating the shape of a magnetic flux guide member according to another embodiment.

A magnetic flux guide member 565C in a magnetic sensor module 555C illustrated in FIG. 29A has a main body 60 having a trapezoidal shape where the long side on which extensions 61 and 62 are provided is longer than the long side toward the central axis O of the yokes 31 and 32. A magnetic flux guide member 565D in a magnetic sensor module 555D illustrated in FIG. 29B has a main body 60 having a substantially V-shaped cutout with a recess oriented toward extensions 61 and 62 along the reference line X in the long side near the central axis O of the yokes 31 and 32.

Figure 30:
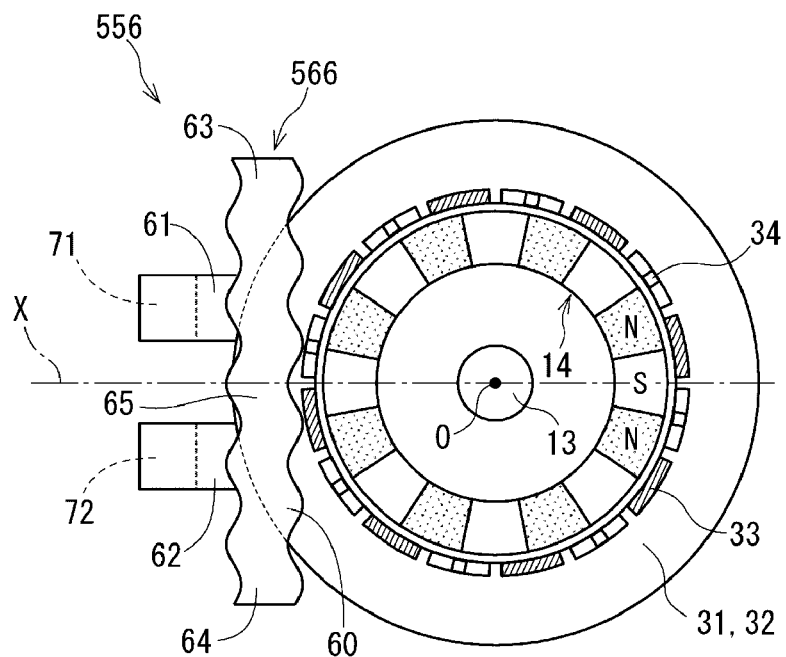
FIG. 30 is a diagram illustrating the shape of a magnetic flux guide member according to another embodiment.

A main body 60 having a substantially rectangular shape whose long sides have wave shapes, as in a magnetic flux guide member 566 in a magnetic sensor module 556 illustrated in FIG. 30, is also to be construed as having a "rectangular strip shape." The number of waves and the size of the protrusions and recesses are not limited to the example provided in the drawing. The shape of waves may also be triangular or a saw-toothed shape. Technically, a surface that appears to be straight to the naked eye can be considered wave-shaped microscopically. A main body having an arc shape as in the third embodiment described above may have opposite sides that are similarly wave-shaped.

Figure 31:
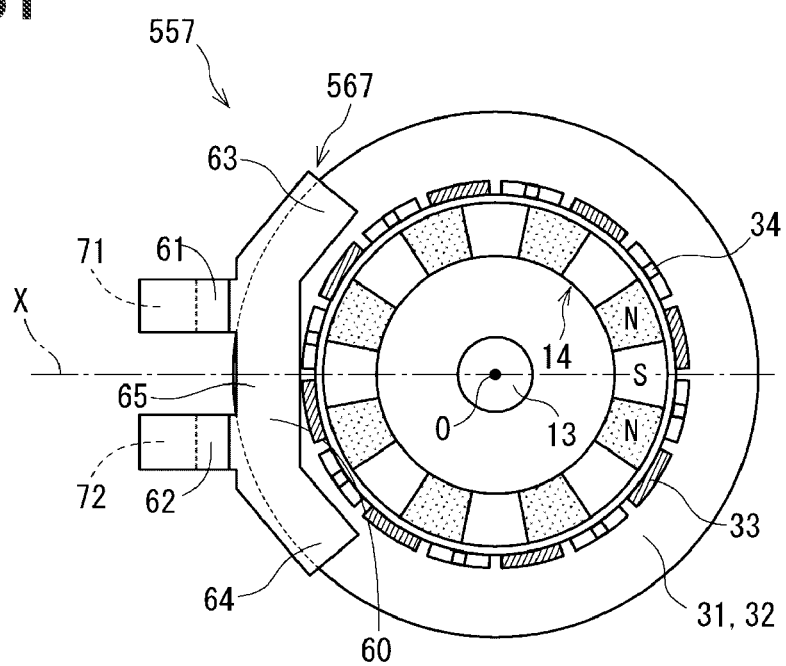
FIG. 31 is a diagram illustrating the shape of a magnetic flux guide member according to another embodiment.

(b) While each of the main bodies 60 of the magnetic flux guide members 512 and 513 in the second and third embodiments described above has an arc shape, the main body 60 may have a shape that configures a part of a polygonal shape as with a magnetic flux guide member 567 in a magnetic sensor module 557 illustrated in FIG. 31. In an example illustrated in FIG. 31, a main body 60 is configured using three straight line portions formed by bending a main straight line portion of the main body 60 at both ends inward in the radial direction. In other examples, the main body 60 may be configured using two straight line portions, together having a substantially V shape, or four or more straight line portions.

Figure 32A:
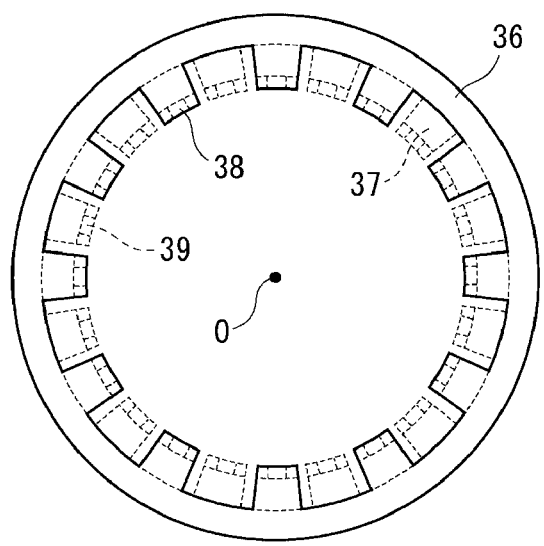
FIG. 32A is a plan view of yokes according to another embodiment.
Figure 32B:
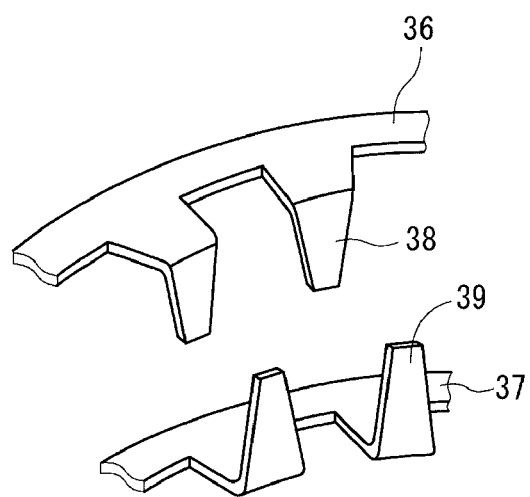
FIG. 32B is a partial perspective view of the yokes according to the other embodiment.

(c) The yokes 31 and 32 in the embodiments described above illustrated in the drawings such as FIG. 1 each have a ring shape having a constant width, and the claws 33 and 34 are bent on the respective inner circumferences of the yokes 31 and 32 in the axial direction. In contrast, each of yokes 36 and 37 illustrated in FIGS. 32A and 32B has cutouts in a corresponding ring portion at inner locations of the ring portion between the corresponding ones of claws 38 and 39, thus having a reduced width. In other words, the claws 38 and 39 protrude from the ring portions inward in the radial direction and then bent in the axial direction. The area of the magnetic circuit corresponding to the claws 38 and 39 can be thus enlarged, increasing magnetic flux to be collected by the yokes 36 and 37.

(d) The magnetic flux guide members 51 and 52 according to the embodiments described above are assumed to be made of a single soft magnetic material, and the difference in facing area with the yokes 31 and 32 or the difference in gap from the yokes 31 and 32 causes magnetic permeance to be different at different locations. Alternatively, the expression (1) shows that it is theoretically possible to provide different magnetic permeance at different locations by making the magnetic flux guide member by joining two or more different types of materials having different magnetic permeability μ.

(e) In the embodiments described above, the multipolar magnet 14 is secured to the input shaft 11 and the yokes 31 and 32 are secured to the output shaft 12. Alternatively, the multipolar magnet 14 may be secured to the output shaft 12 and the yokes 31 and 32 may be secured to the input shaft 11. Alternatively, the multipolar magnet 14 may be secured to one end portion of the torsion bar 13, and the yokes 31 and 32 may be secured to the other end portion of the torsion bar 13.

(f) The torque detection device of the present disclosure can be used not only in electric power steering systems but also in various other types of devices for detecting shaft torque.

The present disclosure is not restricted to the embodiments mentioned, and can be implemented with various modification in the range not deviating from the scope of the present disclosure.

The structures of the above embodiments are merely exemplary, and technical scopes of the disclosure are not limited to the disclosed scopes. The present embodiment is therefore to be considered in all respects as illustrative and not restrictive, and all changes which come within the meaning and range of equivalency of the claims are therefore intended to be embraced therein. The disclosure encompasses replacement or combination of parts and/or elements between one embodiment and another and should be understood to include all modifications within the meaning and scope equivalent to the descriptions in the claims.

What is claimed is:

1. A torque detection device comprising:
   a torsion bar, coupling a first shaft and a second shaft concentrically, configured to convert torque applied between the first shaft and the second shaft to a torsional displacement;
   a multipolar magnet secured to the first shaft or one end portion of the torsion bar and including N-poles and S-poles disposed alternately in a circumferential direction;
   a pair of yokes made of a soft magnetic material, placed outside of the multipolar magnet in a radial direction, secured to the second shaft or another end portion of the torsion bar, facing each other in an axial direction, and forming a magnetic circuit in a magnetic field of the multipolar magnet;
   at least one magnetic flux guide member made of a soft magnetic material, configured to guide magnetic flux of the magnetic circuit, and having a main body facing at least one of the yokes; and
   at least one magnetic sensor configured to detect magnetic flux guided by the at least one magnetic flux guide member, and placed at the main body of the at least one magnetic flux guide member or at an extension of the at least one magnetic flux guide member branched from the main body,
   wherein
   a number of the at least one magnetic flux guide member is two, and the two magnetic flux guide members respectively face the two yokes,
   each of the two magnetic flux guide members has the extension extending outward from the main body in the radial direction of the yokes,
   the at least one magnetic sensor is disposed between the extensions of the two magnetic flux guide members,
   in a projection view of the yokes in the axial direction,
     an imaginary straight line connecting a middle position of the at least one magnetic sensor to a central axis of the yokes is defined as a reference line,
     the main body of the magnetic flux guide member has a rectangular strip shape having a longitudinal side orthogonal to the reference line,
     the main body of the at least one magnetic flux guide member is defined to have an end portion corresponding to ends of the at least one of the yokes in the circumferential direction across the reference line within a range where the main body faces the at least one of the yokes, and
     the at least one magnetic flux guide member is configured to allow magnetic permeance per unit area between the at least one magnetic flux guide member and the yoke to be greater at a location of the at least one magnetic sensor in the main body, or at a location in the main body from which the extension is branched, than at the end portion, and
     the main bodies of the two magnetic flux guide members are disposed symmetrically with respect to the reference line.

2. The torque detection device according to claim 1, wherein a distance from the location of the at least one magnetic sensor in the main body or from the location in the main body from which the extension is branched, to the central axis of the yokes is shorter than a distance from the end portion to the central axis of the yokes.

3. The torque detection device according to claim 2, wherein, in a projection view of the yokes in the axial direction,
   the at least one magnetic flux guide member has a side near the central axis of the yokes, the side being a straight line.

4. The torque detection device according to claim 3, wherein, in a projection view of the yokes in the axial direction,
   the at least one magnetic flux guide member has a side near the central axis of the yokes, the side being a straight line orthogonal to the reference line.

5. The torque detection device according to claim 1, wherein a number of the at least one magnetic sensor is two and the two magnetic sensors are disposed symmetrically with respect to the reference line.

6. The torque detection device according to claim 1, wherein the at least one magnetic flux guide member faces the at least one of the yokes at least in the axial direction of the yokes.

7. The torque detection device according to claim 1, wherein the at least one magnetic flux guide member faces the at least one of the yokes at least in the radial direction of the yokes.

8. The torque detection device according to claim 1, wherein the extensions of the two magnetic flux guide members each have a step in the axial direction of the yokes so as to have a minimum gap between the extensions in a location where the at least one magnetic sensor is placed.

9. The torque detection device according to claim 1, wherein, in a projection view of the yokes in the axial direction, when two straight lines connecting a central axis of the multipolar magnet to the circumferential end portions at both ends of the main body of each of the magnetic flux guide members define a range in the circumferential direction referred to as a magnetic flux radiation range, a number of magnetic poles of the multipolar magnet included in the magnetic flux radiation range is in a range of 1.2 to 2.8.

10. A magnetic sensor module for the torque detection device according to claim 1, wherein the at least one magnetic flux guide member and the at least one magnetic sensor are integrally formed with one another.

11. A torque detection device comprising:
a torsion bar, coupling a first shaft and a second shaft concentrically, configured to convert torque applied between the first shaft and the second shaft to a torsional displacement;
a multipolar magnet secured to the first shaft or one end portion of the torsion bar and including N-poles and S-poles disposed alternately in a circumferential direction;
a pair of yokes made of a soft magnetic material, placed outside of the multipolar magnet in a radial direction, secured to the second shaft or another end portion of the torsion bar, facing each other in an axial direction, and forming a magnetic circuit in a magnetic field of the multipolar magnet;
two magnetic flux guide members made of a soft magnetic material, configured to guide magnetic flux of the magnetic circuit, and having a main body facing at least one of the yokes; and
at least one magnetic sensor configured to detect magnetic flux guided by the two magnetic flux guide members, and placed at an extension of the two magnetic flux guide members branched from the main body and extended outward from the main body in the radial direction of the yokes,
wherein
the two magnetic flux guide members respectively face the two yokes,
each of the two magnetic flux guide members has the extension extending outward from the main body in the radial direction of the yokes,
the at least one magnetic sensor is disposed between the extensions of the two magnetic flux guide members,
in a projection view of the yokes in the axial direction,
an imaginary straight line connecting a middle position of the at least one magnetic sensor to the central axis of the yokes is defined as a reference line,
the main body of the two magnetic flux guide members is defined to have an end portion corresponding to ends of the at least one of the yokes in the circumferential direction across the reference line within a range where the main body faces the at least one of the yokes,
the two magnetic flux guide members are configured to allow magnetic permeance per unit area between the magnetic flux guide member and the yoke to be greater at a location of the at least one magnetic sensor in the main body, or at a location in the main body from which the extension is branched, than at the end portion,
the main bodies of the two magnetic flux guide members are disposed symmetrically with respect to the reference line and the main body has a strip shape having opposite sides that are concentric arcs extending in the circumferential direction along the yokes, and
when two straight lines connecting a central axis of the multipolar magnet to the end portions at both ends of the main body of each of the two magnetic flux guide members define a range in the circumferential direction referred to as a magnetic flux radiation range, the number of magnetic poles of the multipolar magnet included in the magnetic flux radiation range is less than 2.5.

12. A torque detection device, comprising:
a torsion bar, coupling a first shaft and a second shaft concentrically, configured to convert torque applied between the first shaft and the second shaft to a torsional displacement;
a multipolar magnet secured to the first shaft or one end portion of the torsion bar and including N-poles and S-poles disposed alternately in a circumferential direction;
a pair of yokes made of a soft magnetic material, placed outside of the multipolar magnet in a radial direction, secured to the second shaft or another end portion of the torsion bar, facing each other in an axial direction, and forming a magnetic circuit in a magnetic field of the multipolar magnet;
at least one magnetic flux guide member, made of a soft magnetic material and having a main body facing at least one of the yokes to guide magnetic flux of the magnetic circuit; and
at least one magnetic sensor, placed at the main body of the at least one magnetic flux guide member or at extensions branched from the main body to detect magnetic flux guided by the magnetic flux guide member,
wherein
a number of the at least one magnetic flux guide member is two, and the two magnetic flux guide members respectively face the two yokes,
each of the two magnetic flux guide members has the extension extending outward from the main body in the radial direction of the yokes,
the at least one magnetic sensor is disposed between the extensions of the two magnetic flux guide members,
in a projection view of the yokes in the axial direction,
an imaginary straight line connecting a middle position between the at least one magnetic sensor to the central axis of the yokes is defined as a reference line,
the at least one magnetic flux guide member has a side near the central axis of the yokes, the side being a straight line orthogonal to the reference line,
the main body of the magnetic flux guide member has a rectangular strip shape having a longitudinal side orthogonal to the reference line,
the at least one magnetic sensor are disposed symmetrically with respect to the reference line, and
the at least one magnetic flux guide member is configured to allow magnetic permeance per unit area between the at least one magnetic flux guide member and the yoke to be smaller at a location of the at least one magnetic sensor in the main body, or at a location in the main body from which the extension is branched, than at a location on the reference line, and the main bodies of the two magnetic flux guide members are disposed symmetrically with respect to the reference line.

13. The torque detection device according to claim 12, wherein, in a projection view of the yokes in the axial direction, when two straight lines connecting a central axis of the multipolar magnet to the circumferential end portions at both ends of the main body of each of the magnetic flux guide members define a range in the circumferential direction referred to as a magnetic flux radiation range, a number of magnetic poles of the multipolar magnet included in the magnetic flux radiation range is in a range of 1.2 to 2.8.

14. The torque detection device according to claim 12, wherein, the at least one magnetic flux guide member is configured to allow magnetic permeance per unit area between the at least one magnetic flux guide member and the yoke to be greater at a location of the at least one magnetic sensor in the main body, or at a location in the main body from which the extension is branched, than at the end portion.

\* \* \* \* \*